(12) United States Patent
Tabata

(10) Patent No.: US 11,735,423 B2
(45) Date of Patent: Aug. 22, 2023

(54) WORKPIECE PROCESSING METHOD

(71) Applicant: TOKYO ELECTRON LIMITED, Tokyo (JP)

(72) Inventor: Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/728,618

(22) Filed: Apr. 25, 2022

(65) Prior Publication Data
US 2022/0254635 A1    Aug. 11, 2022

Related U.S. Application Data

(63) Continuation of application No. 16/925,934, filed on Jul. 10, 2020, now Pat. No. 11,322,354, which is a
(Continued)

(30) Foreign Application Priority Data

Aug. 25, 2017  (JP) .................................. 2017-162602

(51) Int. Cl.
*H01J 37/32*  (2006.01)
*H01L 21/02*  (2006.01)
(Continued)

(52) U.S. Cl.
CPC ........ *H01L 21/0337* (2013.01); *H01J 37/321* (2013.01); *H01J 37/32724* (2013.01);
(Continued)

(58) Field of Classification Search
None
See application file for complete search history.

(56) References Cited

U.S. PATENT DOCUMENTS

2007/0232071 A1    10/2007  Balseanu et al.
2014/0220709 A1*   8/2014  Kimura ............. H01L 21/67248
                                                       156/345.24
(Continued)

FOREIGN PATENT DOCUMENTS

JP        2004-080033 A      3/2004
KR   10-2008-0106984 A      12/2008
(Continued)

*Primary Examiner* — Shamim Ahmed
(74) *Attorney, Agent, or Firm* — Weihrouch IP

(57) ABSTRACT

Based on the fact that a film thickness of a film formed in a film formation processing of repeatedly performing a first sequence varies according to a temperature of the surface on which the film is to be formed, the film formation processing is performed after the temperature of each region of the surface of the wafer is adjusted to reduce a deviation of a trench on the surface of the wafer, so that the film is very precisely formed on the inner surface of the trench while reducing the deviation of the trench on the surface of the wafer. When the trench width is narrower than a reference width, an etching processing of repeatedly performing a second sequence is performed in order to expand the trench width, so that the surface of the film provided in the inner surface of the trench is isotropically and uniformly etched.

20 Claims, 20 Drawing Sheets

Related U.S. Application Data continuation of application No. 16/111,789, filed on Aug. 24, 2018, now Pat. No. 10,748,766.

(51) Int. Cl.
*H01L 21/67* (2006.01)
*H01L 21/033* (2006.01)
*H01L 21/66* (2006.01)
*H01L 21/683* (2006.01)
*H01L 21/311* (2006.01)

(52) U.S. Cl.
CPC .... *H01L 21/0228* (2013.01); *H01L 21/02164* (2013.01); *H01L 21/02219* (2013.01); *H01L 21/02274* (2013.01); *H01L 21/0338* (2013.01); *H01L 21/31116* (2013.01); *H01L 21/31144* (2013.01); *H01L 21/67069* (2013.01); *H01L 21/67103* (2013.01); *H01L 21/67253* (2013.01); *H01L 21/6831* (2013.01); *H01L 21/6833* (2013.01); *H01L 22/20* (2013.01); *H01J 2237/3321* (2013.01); *H01J 2237/3343* (2013.01); *H01J 2237/3344* (2013.01); *H01L 22/12* (2013.01)

(56) References Cited

U.S. PATENT DOCUMENTS

| | | |
|---|---|---|
| 2015/0295005 A1 | 10/2015 | Tseng et al. |
| 2015/0364473 A1 | 12/2015 | Kim et al. |
| 2016/0027912 A1 | 1/2016 | Asahara |
| 2016/0203995 A1 | 7/2016 | Kanarik et al. |
| 2017/0012098 A1 | 1/2017 | Park |
| 2017/0033178 A1 | 2/2017 | Krishnan et al. |
| 2017/0256437 A1 | 9/2017 | Helm et al. |
| 2018/0033689 A1 | 2/2018 | Anthis et al. |

FOREIGN PATENT DOCUMENTS

| | | |
|---|---|---|
| KR | 10-2016-0087348 A | 7/2016 |
| TW | 201727706 A | 8/2017 |

* cited by examiner

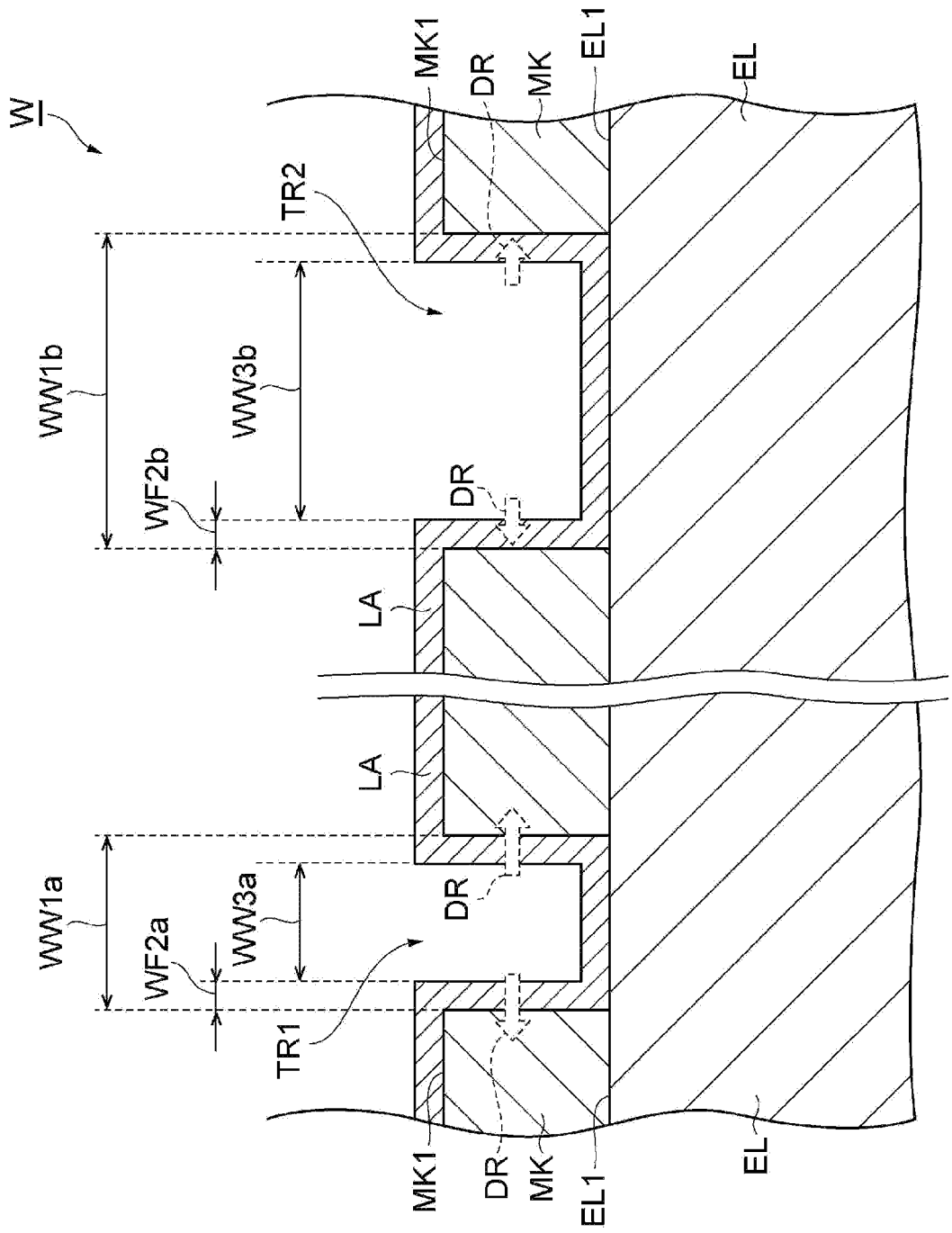

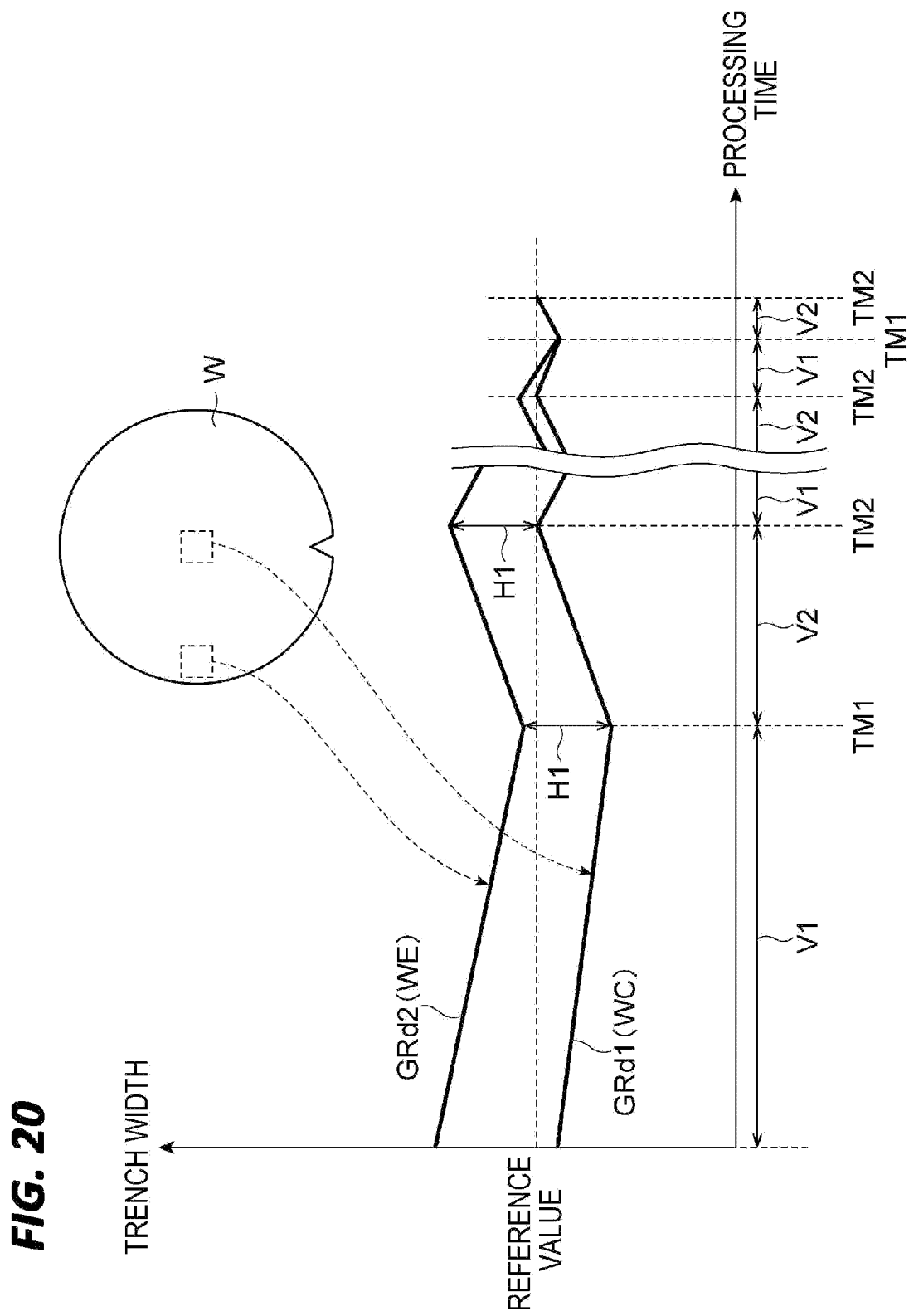

WORKPIECE PROCESSING METHOD

CROSS-REFERENCE TO RELATED APPLICATIONS

This application is a continuation of U.S. patent application Ser. No. 16/925,934, filed on Jul. 10, 2020, which is a continuation of U.S. patent application Ser. No. 16/111,789, filed on Aug. 24, 2018, now U.S. Pat. No. 10,748,766, issued Aug. 18, 2020, which claims priority from Japanese Patent Application No. 2017-162602, filed on Aug. 25, 2017, all of which are incorporated herein in their entirety by reference and priority is claimed to each.

TECHNICAL FIELD

The present disclosure relates to a method of processing a workpiece.

BACKGROUND

In a process of manufacturing an electronic device, a mask is formed on a processing target layer, and an etching is performed to transfer the pattern of the mask on the processing target layer. As for the etching, a plasma etching may be used. A resist mask used for the plasma etching is formed by a photolithography technique. Accordingly, the critical dimension of the pattern formed on the processing target layer depends on the resolution of the resist mask formed by the photolithography technique. The resolution of the resist mask has a resolution limit. A demand for the high integration of an electronic device has increased, and it has been required to form a pattern having a dimension smaller than the resolution limit of the resist mask. Thus, as disclosed in Japanese Laid-Open Patent Publication No. 2004-080033, a technique has been suggested which adjusts the dimensional shape of the resist mask to reduce the width of an opening provided by the resist mask.

SUMMARY

An aspect of the present disclosure provides a method of processing a workpiece. In the workpiece, a plurality of trenches is provided in the surface of the workpiece. The method is provided with a basic process including: a first process of measuring a trench width of each of the plurality of trenches; a second process of adjusting the trench width when a deviation of the trench width measured in the first process on the surface is not within a preset reference range; and a third process of performing an etching processing for expanding the trench width when the deviation is within the reference range, and the trench width measured in the first process is narrower than a predetermined reference width. In the method, the surface is divided into a plurality of regions. The second process includes a fourth process of adjusting a temperature of the surface for each of the plurality of regions, and a fifth process of performing a film formation processing for forming a film in an inner surface of the trench. The fourth process adjusts the temperature of the surface so as to reduce the deviation by the formation of the film, using pre-obtained correspondence data representing a correspondence between the temperature of the surface and a film thickness of the film deposited on the inner surface of the trench in the film formation processing. The film formation processing repeatedly performs a first sequence including: a sixth process of supplying a first gas into a processing container of a plasma processing apparatus in which the workpiece is accommodated; a seventh process of purging a space inside the processing container after the performance of the sixth process; an eighth process of generating plasma of a second gas inside the processing container after the performance of the seventh process; and a ninth process of purging the space inside the processing container after the performance of the eighth process. The etching processing removes the film for each atomic layer so as to isotropically etch the film, by repeatedly performing a second sequence including: a tenth process of generating plasma of a third gas inside the processing container and isotropically forming a mixture layer including ions included in the plasma of the third gas on atomic layers of the inner surfaces of the trenches; an eleventh process of purging the space inside the processing container after the performance of the tenth process; a twelfth process of generating plasma of a fourth gas inside the processing container and removing the mixture layer by radicals included in the plasma of the fourth gas after the performance of the eleventh process; and a thirteenth process of purging the space inside the processing container after the performance of the twelfth process. The film includes silicon. The first gas includes an aminosilane-based gas. The second gas includes a gas containing oxygen atoms. The third gas includes nitrogen. The fourth gas includes fluorine. The plasma of the fourth gas generated in the twelfth process includes radicals for removing the mixture layer including nitride of silicon. The sixth process does not generate plasma of the first gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 16 is a cross-sectional view illustrating a state of the workpiece after the performance of the etching in the process illustrated in FIG. 10.

FIG. 20 is a view schematically illustrating a variation of a trench width when the method illustrated in FIG. 1 is repeatedly performed.

DETAILED DESCRIPTION

Figure 1:
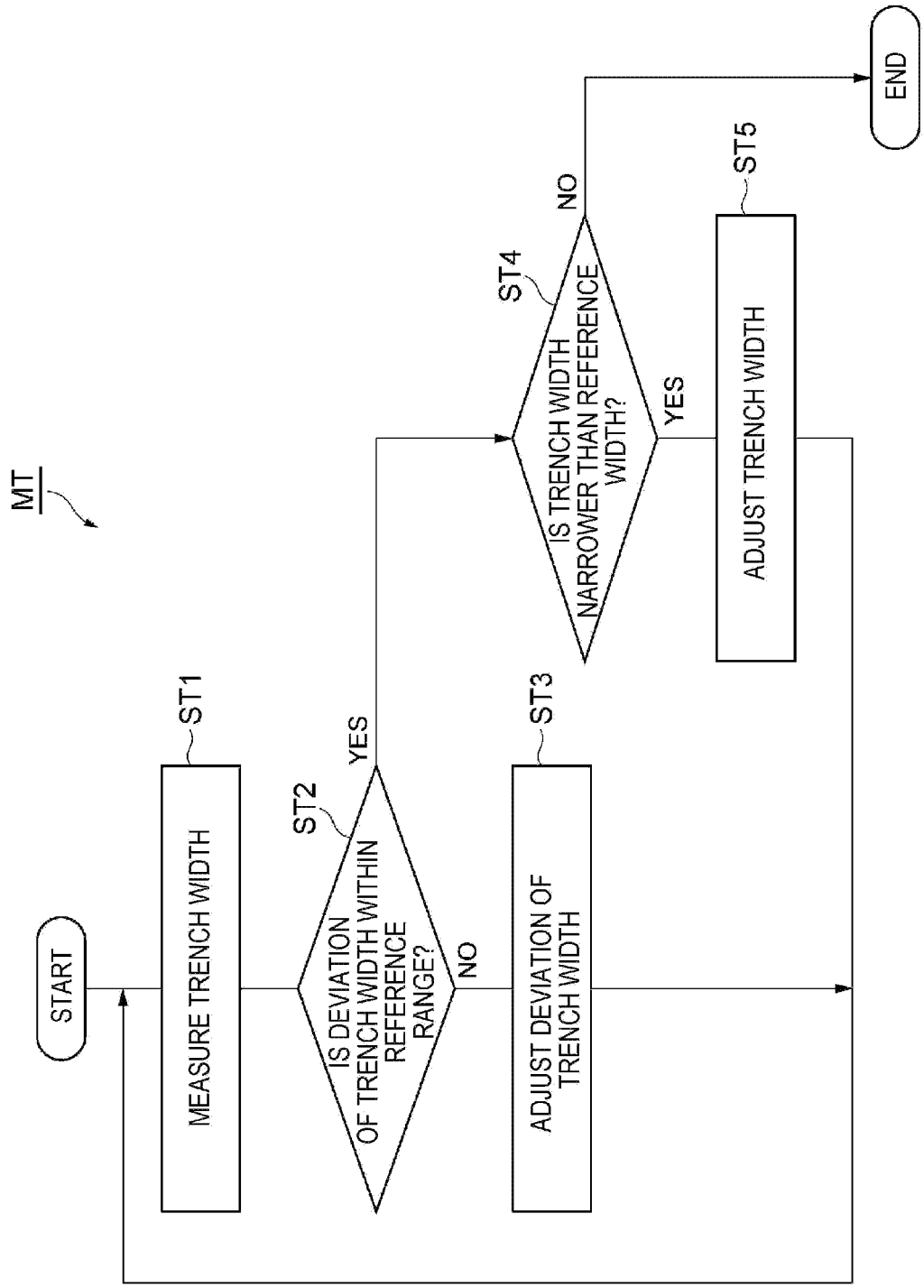
FIG. 1 is a flowchart illustrating a part of a method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

A formation of a pattern can be implemented by forming very precise trenches in a processing target layer such as, for example, a $SiO_2$ layer. When a pattern is formed with the dimension smaller than the resolution limit of the resist mask, a control of a very precise minimum line width (critical dimension (CD)) of each trench of the pattern is required. The deviation of the minimum line width is largely affected as the pattern is detailed. The minimum line width may vary depending on, for example, each portion (e.g., a central portion, an intermediate portion, or an end portion) of a wafer. Thus, in forming the pattern on the workpiece having the processing target layer such as, for example, $SiO_2$, there has been a demand for implementing a method of suppressing the deviation of the very precise minimum line width, for the miniaturization accompanied by the high integration.

An aspect of the present disclosure provides a method of processing a workpiece. In the workpiece, a plurality of trenches is provided in the surface of the workpiece. The method is provided with a basic process including: a first process of measuring a trench width of each of the plurality of trenches; a second process of adjusting the trench width when a deviation of the trench width measured in the first process on the surface is not within a preset reference range; and a third process of performing an etching processing for expanding the trench width when the deviation is within the reference range, and the trench width measured in the first process is narrower than a predetermined reference width. In the method, the surface is divided into a plurality of regions.

The second process includes a fourth process of adjusting a temperature of the surface for each of the plurality of regions, and a fifth process of performing a film formation processing for forming a film in an inner surface of the trench. The fourth process adjusts the temperature of the surface so as to reduce the deviation by the formation of the film, using pre-obtained correspondence data representing a correspondence between the temperature of the surface and a film thickness of the film deposited on the inner surface of the trench in the film formation processing. The film formation processing repeatedly performs a first sequence including: a sixth process of supplying a first gas into a processing container of a plasma processing apparatus in which the workpiece is accommodated; a seventh process of purging a space inside the processing container after the performance of the sixth process; an eighth process of generating plasma of a second gas inside the processing container after the performance of the seventh process; and a ninth process of purging the space inside the processing container after the performance of the eighth process. The etching processing removes the film for each atomic layer so as to isotropically etch the film, by repeatedly performing a second sequence including: a tenth process of generating plasma of a third gas inside the processing container and isotropically forming a mixture layer including ions included in the plasma of the third gas on atomic layers of the inner surfaces of the trenches; an eleventh process of purging the space inside the processing container after the performance of the tenth process; a twelfth process of generating plasma of a fourth gas inside the processing container and removing the mixture layer by radicals included in the plasma of the fourth gas after the performance of the eleventh process; and a thirteenth process of purging the space inside the processing container after the performance of the twelfth process. The film includes silicon. The first gas includes an aminosilane-based gas. The second gas includes a gas containing oxygen atoms. The third gas includes nitrogen. The fourth gas includes fluorine. The plasma of the fourth gas generated in the twelfth process includes radicals for removing the mixture layer including nitride of silicon. The sixth process does not generate plasma of the first gas.

In the method described above, based on the fact that the film thickness of the film formed in the film formation processing of repeatedly performing the first sequence by the same method as an atomic layer deposition (ALD) method varies according to the temperature of the surface on which the film is to be formed, the film formation processing is performed after the temperature of each region of the surface of the workpiece is adjusted in the fourth process so as to reduce the deviation of the trench width of each of the plurality of trenches provided in the surface of the workpiece, on the corresponding surface (to improve the in-plane uniformity of the trench width on the surface of the workpiece). Thus, while the deviation of the trench width of each of the plurality of trenches provided in the surface of the workpiece, on the corresponding surface, is reduced, a film including silicon oxide is very precisely formed on the inner surface of the trench for each atomic layer. In addition, when the trench width of the trench in which the film is formed is narrower than a reference width, an etching processing of repeatedly performing the second sequence by the same method as an atomic layer etching (ALE) method is performed in order to expand the trench width. Thus, the surface of the film provided in the inner surface of the trench is isotropically and uniformly etched, and the trench width is adjusted to a desired reference width. Accordingly, when the deviation of the trench width occurs on the surface of the workpiece, it is possible to adjust the trench width to a desired reference width while sufficiently reducing the deviation.

In an embodiment, the basic process returns to the first process after the performance of the second process and the performance of the third process. Since the basic process returns to the first process of measuring the trench width after the performance of the second process of adjusting the trench width by forming a film and the performance of the third process of expanding the trench width by an etching, it is possible to more precisely adjust the trench width.

In an embodiment, the basic process is repeatedly performed, and the reference range is reduced step by step each time the basic process is performed. When the basic process is repeatedly performed while reducing the reference range for the deviation of the trench width step by step, the trench width may be adjusted while relatively gradually increasing the thickness of the film formed in the second process step by step. Thus, even when the trenches include a trench having a relatively narrow trench width, it is possible to avoid the situation where the opening of the trench is clogged by the formation of the film.

In an embodiment, the first gas includes monoaminosilane. By using the first gas including monoaminosilane, a reaction precursor of silicon may be formed.

In an embodiment, the aminosilane-based gas of the first gas may include aminosilane having 1 to 3 silicon atoms. The aminosilane-based gas of the first gas may include aminosilane having 1 to 3 amino groups. Accordingly, aminosilane having 1 to 3 silicon atoms may be used as the aminosilane-based gas of the first gas. Further, aminosilane having 1 to 3 amino groups may be used as the aminosilane-based gas of the first gas.

In an embodiment, the fourth gas may be a mixture gas including $NF_3$ gas and $O_2$ gas, a mixture gas including $NF_3$ gas, $O_2$ gas, $H_2$ gas, and Ar gas, or a mixture gas including $CH_3F$ gas, $O_2$ gas, and Ar gas. Accordingly, the fourth gas containing fluorine may be implemented.

As described above, it is possible to provide a method of suppressing the deviation of the very precise minimum line width in forming a pattern on the workpiece.

Figure 2:
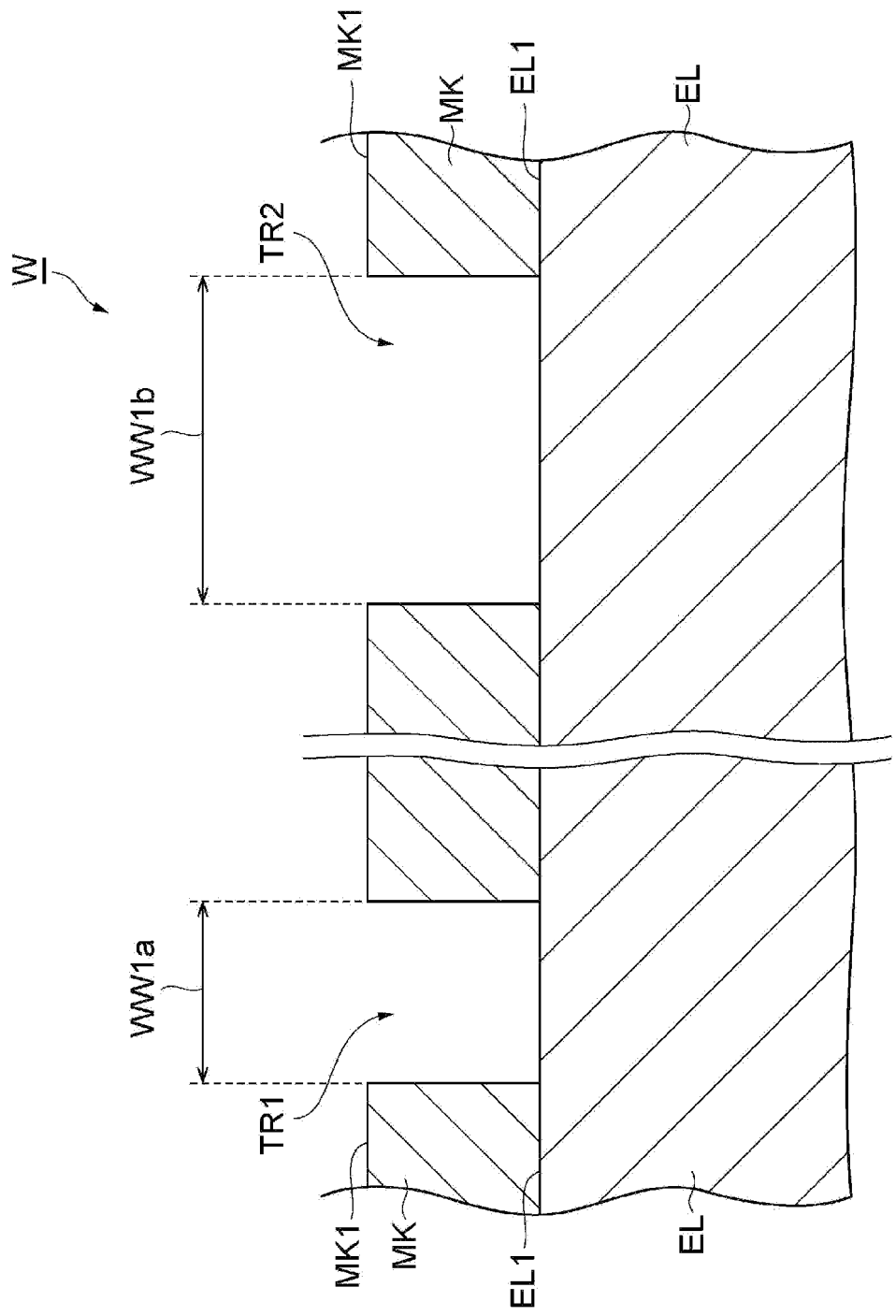
FIG. 2 is a cross-sectional view illustrating an example of a workpiece to which the method illustrated in FIG. 1 is applied.

Hereinafter, various embodiments will be described in detail with reference to the drawings. In the respective drawings, similar or corresponding parts will be denoted by the same reference numeral. FIG. 1 is a flowchart illustrating a part of a method according to an embodiment (hereinafter, referred to as a "method MT"). The method MT illustrated in FIG. 1 is an embodiment of the method of processing a workpiece (hereinafter, referred to as a "wafer W"). FIG. 2 is a cross-sectional view illustrating an example of the workpiece (wafer W) to which the method MT illustrated in FIG. 1 is applied.

As illustrated in FIG. 2, the wafer W includes a processing target layer EL, a mask MK provided on the processing target layer EL (on the surface EL1 of the processing target layer EL), and trenches provided in the mask MK (e.g., trenches TR1 and TR2; the trenches may have other similar shapes such as, for example, a dent, a recess, and a hole in the present embodiment; the same applies hereinafter). The wafer W is provided with a plurality of trenches in the surface thereof. While the trenches are provided in the mask MK in the present embodiment, the present disclosure is not limited to the configuration where the trenches are provided in the mask MK.

The material of the processing target layer EL includes silicon oxide and may include, for example, $SiO_2$ in an embodiment. The material of the mask MK may include, for example, TiN in an embodiment. In the mask MK, trenches of a pattern for providing openings (which are the same as the trenches provided in the surface of the wafer W) are formed by the photolithography. In an embodiment, the wafer W is provided with two types of trenches having different trench widths, that is, the trenches TR1 and TR2 illustrated in FIG. 2. The trenches TR1 and TR2 are different from each other in trench width. The trench TR1 has the trench width WW1$a$, and the trench TR2 has the trench width WW1$b$. In the trenches TR1 and TR2 illustrated in FIG. 2, the value of the trench width WW1$a$ is smaller than the value of the trench width WW1$b$. The trench TR1 is formed on the roughly entire surface of the wafer W across the central portion, the intermediate portion, and the end portion of the surface of the wafer W (the intermediate portion is located between the central portion and the end portion). The trench TR2 is formed on the roughly entire surface of the wafer W across the central portion, the intermediate portion, and the end portion of the surface of the wafer W. In addition, the types of the trenches provided in the surface of the wafer W are not limited to the two types of the trenches TR1 and TR2. Both the trenches TR1 and TR2 illustrated in FIG. 2 are present in the same region (a region ER to be described later, more specifically, any one of the central portion, the intermediate portion, and the end portion of the surface of the wafer W).

Figure 3:
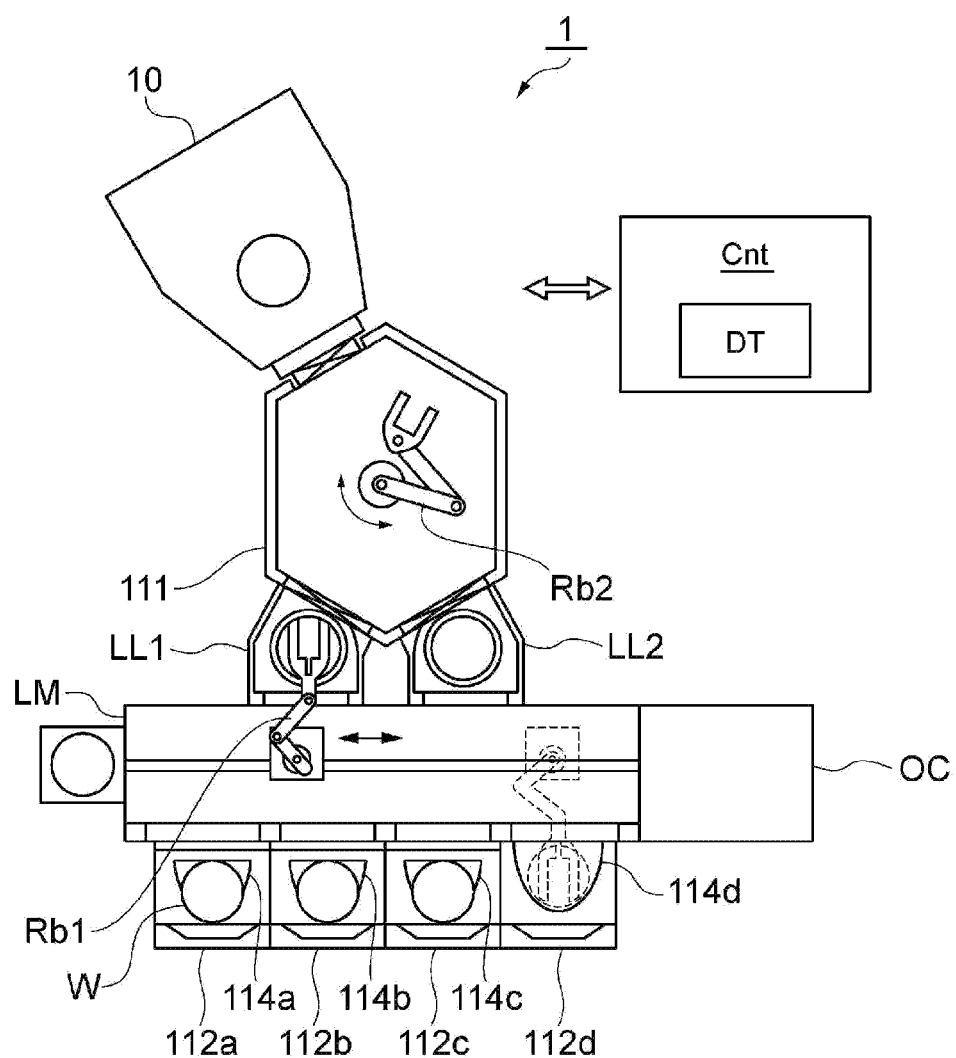
FIG. 3 is a view illustrating an example of a processing system which is usable for implementing the method illustrated in FIG. 1.

The method MT (the method of processing a workpiece) is performed by a processing system including a plasma processing apparatus. FIG. 3 is a view illustrating an example of the processing system that is usable for performing the method MT illustrated in FIG. 1. As illustrated in FIG. 3, a processing system 1 includes a controller Cnt, tables 112$a$, 112$b$, 112$c$, and 112$d$, accommodation containers 114$a$, 114$b$, 114$c$, and 114$d$, a loader module LM, load lock chambers LL1 and LL2, a transfer chamber 111, an optical observation apparatus OC, and a plasma processing apparatus 10.

The controller Cnt is a computer provided with, for example, a processor, a storage unit, an input device, and a display device, and controls the respective units of the processing system 1 to be described later. The controller Cnt is connected to, for example, transfer robots Rb1 and Rb2, the optical observation apparatus OC, and the plasma processing apparatus 10. Further, in the plasma processing apparatus 10 illustrated in FIG. 4 to be described later, the controller Cnt is connected to, for example, a mass flow controller 124, an opening/closing valve 126, high frequency power supplies 150A and 150B, a DC power supply 22, a switch 23, an exhaust device 50, a high frequency power supply 64, a matching unit 68, an electrostatic chuck ESC, a heater power supply HP, and a chiller unit.

The controller Cnt operates according to a computer program for controlling each unit of the processing system 1 in each process of the method MT (a program based on an input recipe), so as to send out a control signal. Each unit of the processing system 1, for example, the transfer robot Rb1 or Rb2, the optical observation apparatus OC, or the plasma processing apparatus 10 is controlled by the control signal from the controller Cnt. In the plasma processing apparatus 10 illustrated in FIG. 4, by the control signal from the controller Cnt, the controller Cnt is able to control, for example, selection and a flow rate of a gas supplied from a gas supply source 122, exhaust of the exhaust device 50, power supply from the high frequency power supplies 150A and 150B, power supply from a high frequency power supply 64, power supply from a heater power supply HP, and a flow rate and a temperature of a refrigerant from the chiller unit. In addition, each process of the method MT disclosed herein may be performed by operating each unit of the processing system 1 under the control of the controller Cnt. In the storage unit of the controller Cnt, the computer program for performing the method MT and various data used for performing the method MT (e.g., correspondence data DT to be described later) are stored so as to be readable.

The tables 112a to 112d are arranged along one edge of the loader module LM. The accommodation containers 114a to 114d are provided on the tables 112a to 112d, respectively. The wafer W may be accommodated in each of the accommodation containers 114a to 114d.

The transfer robot Rb1 is provided inside the loader module LM. The transfer robot Rb1 takes out the wafer W accommodated in any one of the accommodation containers 114a to 114d and transfers the wafer W to the load lock chamber LL1 or LL2.

The load lock chambers LL1 and LL2 are provided along the other edge of the loader module LM and connected to the loader module LM. The load lock chambers LL1 and LL2 constitute a preliminary decompression chamber. Each of the load lock chambers LL1 and LL2 is connected to the transfer chamber 111.

The transfer chamber 111 is capable of performing the decompression, and the transfer robot Rb2 is provided inside the transfer chamber 111. The plasma processing apparatus 10 is connected to the transfer chamber 111. The transfer robot Rb2 takes out the wafer W from the load lock chamber LL1 or LL2, and transfers the wafer W to the plasma processing apparatus 10.

The processing system 1 includes the optical observation apparatus OC. The wafer W can be moved between the optical observation apparatus OC and the plasma processing apparatus 10 by the transfer robots Rb1 and Rb2. After the wafer W is accommodated in the optical observation apparatus OC by the transfer robot Rb1 and positioned inside the optical observation apparatus OC, the optical observation apparatus OC measures the trench widths of the trenches (e.g., the trenches TR1 and TR2) of the mask (e.g., the mask MK illustrated in, for example, FIG. 2) of the wafer W, and transmits the measurement result to the controller Cnt. In the optical observation apparatus OC, the trench widths may be measured for each of a plurality of regions ER (to be described later with reference to FIG. 5) on the surface of the wafer W.

Figure 4:
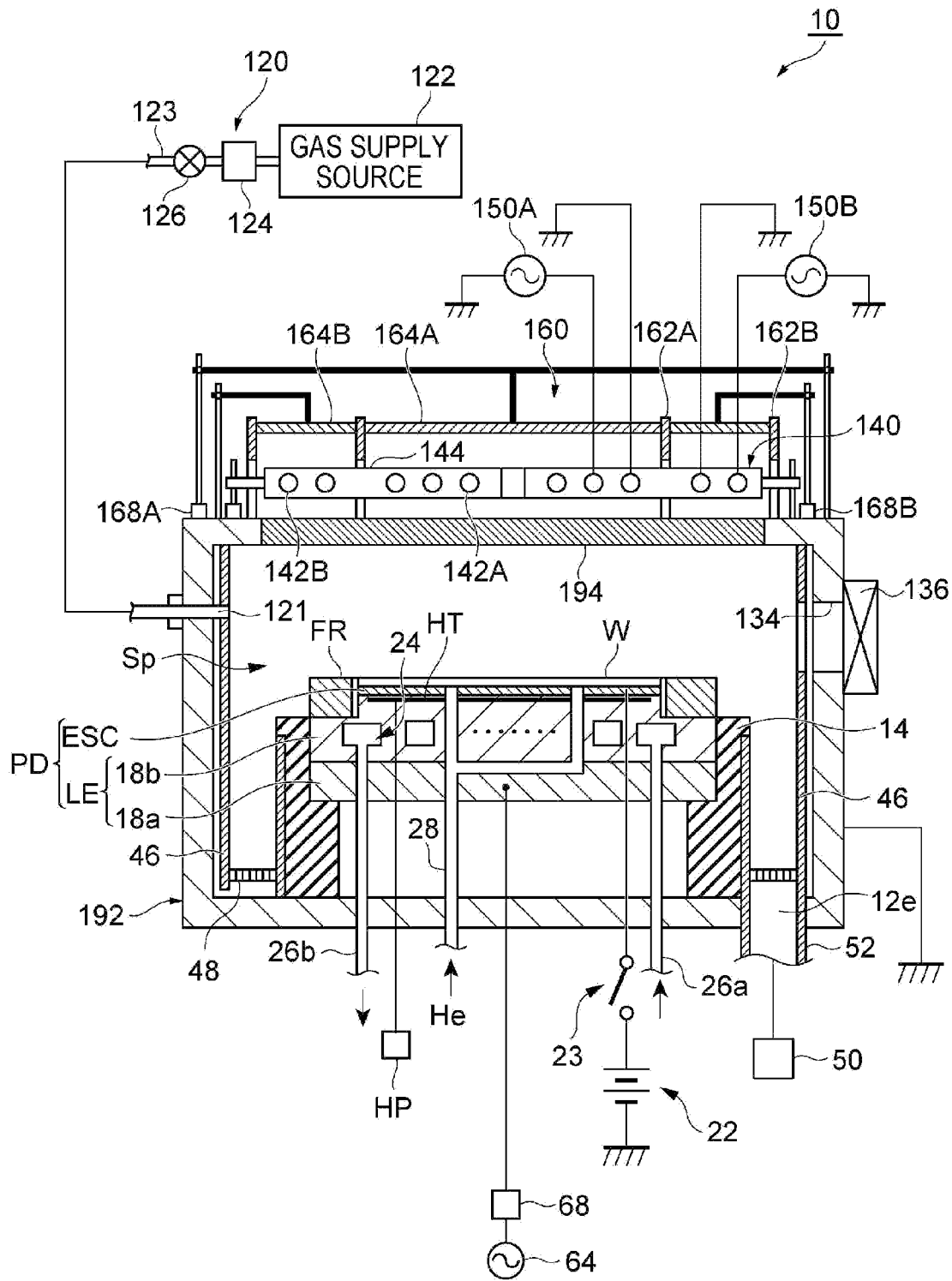
FIG. 4 is a view illustrating an example of a plasma processing apparatus which may be provided in the processing system illustrated in FIG. 4.

FIG. 4 is a view illustrating an example of the plasma processing apparatus 10 which may be provided in the processing system 1 illustrated in FIG. 3. FIG. 4 schematically illustrates a cross-sectional structure of the plasma processing apparatus 10 which is usable in various embodiments of the method MT of processing the wafer W.

The plasma processing apparatus 10 illustrated in FIG. 4 includes an inductively coupled plasma (ICP) type plasma source. The plasma processing apparatus 10 includes a processing container 192 having a tubular shape (e.g., a cylindrical shape in an embodiment) and formed of a metal (e.g., aluminum in an embodiment). The processing container 192 defines a processing space Sp where a plasma processing is performed. The shape of the processing container 192 is not limited to the cylindrical shape, and may be an angular cylindrical shape such as, for example, a box shape in an embodiment. The plasma source of the plasma processing apparatus 10 is not limited to the ICP type, and may be, for example, an electron cyclotron resonance (ECR) type, a capacitively coupled plasma (CCP) type, or a type using microwaves.

A placing table PD is provided on the bottom portion of the processing container 192 to place the wafer W thereon. The placing table PD includes an electrostatic chuck ESC and a lower electrode LE. The lower electrode LE includes a first plate 18a and a second plate 18b. The processing container 192 defines the processing space Sp.

A support unit 14 is provided on the bottom portion of the processing container 192 inside the processing container 192. In an embodiment, the support unit 14 has, for example, a substantially cylindrical shape. In an embodiment, the support unit 14 is formed of, for example, an insulating material. The insulating material of the support unit 14 may contain oxygen like quartz. The support unit 14 extends vertically (the direction from the side of the ceiling of the processing container 192 (specifically, for example, the side of a plate shaped dielectric 194) toward the surface of the wafer W placed on the electrostatic chuck ESC) from the bottom portion of the processing container 192 inside the processing container 192.

The placing table PD is provided inside the processing container 192. The placing table PD is supported by the support unit 14. The placing table PD holds the wafer W on the top surface thereof. The wafer W is the workpiece. The placing table PD includes the lower electrode LE and the electrostatic chuck ESC.

The lower electrode LE includes the first plate 18a and the second plate 18b. The first plate 18a and the second plate 18b are formed of a metal such as, for example, aluminum in an embodiment. In an embodiment, each of the first plate 18a and the second plate 18b has, for example, a substantially disk shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode of a conductive film is disposed between a pair of insulating layers or sheets. The DC power supply 22 is electrically connected to the electrode of the electrostatic chuck ESC via a switch 23. The electrostatic chuck 20 adsorbs the wafer W thereon by an electrostatic force generated by a DC voltage from the DC power supply 22. As a result, the electrostatic chuck 20 may hold the wafer W thereon.

A focus ring FR is disposed on the peripheral edge portion of the second plate 18b to surround the edge of the wafer W and the electrostatic chuck ESC. The focus ring FR is provided to improve the uniformity of the etching. The focus ring FR is formed of a material appropriately selected according to a material of a film to be etched, and may be formed of, for example, quartz in an embodiment.

A refrigerant flow path 24 is provided inside the second plate 18b. The refrigerant flow path 24 constitutes a temperature regulation mechanism. A refrigerant is supplied to the refrigerant flow path 24 from a chiller unit provided outside the processing container 192 through a pipe 26a. The refrigerant supplied to the refrigerant flow path 24 is returned to the chiller unit through a pipe 26b. In this way, the refrigerant is supplied to the refrigerant flow path 24 to circulate therein. By controlling the temperature of the refrigerant, the temperature of the wafer W supported by the electrostatic chuck ESC is controlled. A gas supply line 28 supplies a heat transfer gas from a heat transfer gas supply mechanism, for example, He gas in an embodiment, between the upper surface of the electrostatic chuck ESC and the back surface of the wafer W.

The plasma processing apparatus 10 is provided with a temperature regulator HT for regulating the temperature of the wafer W. The temperature regulator HT is mounted in the electrostatic chuck ESC. A heater power supply HP is connected to the temperature regulator HT. A power is supplied to the temperature regulator HT from the heater power supply HP so that the temperature of the electrostatic chuck ESC is regulated, and the temperature of the wafer W placed on the electrostatic chuck ESC is regulated. In addition, the temperature regulator HT may be embedded in the second plate 18*b*.

The temperature regulator HT includes a plurality of heating elements that emit heat, and a plurality of temperature sensors that detect ambient temperatures of the plurality of heating elements, respectively. The plurality of heating elements is provided for the plurality of regions ER (to be described later), respectively, on the main surface FW of the wafer W when the wafer W is placed and positioned on the electrostatic chuck ESC. When the wafer W is placed and positioned on the electrostatic chuck ESC, the controller Cnt recognizes the heating elements and the temperature sensors which correspond to the plurality of regions ER, respectively, on the surface of the wafer W in association with the regions ER. The controller Cnt is capable of identifying the regions ER, and the heating elements and the temperature sensor which correspond to the regions ER, for each of the plurality of regions (each of the plurality of regions ER) by, for example, numbers such as numerals or characters. The controller Cnt detects the temperature of one region ER by a temperature sensor provided at the position corresponding to the region ER, and adjusts the temperature of the region ER by a heating element provided at the position corresponding to the region ER. In addition, when the wafer W is placed on the electrostatic chuck ESC, the temperature detected by one temperature sensor is the same as the temperature of the region ER on the temperature sensor among the regions of the wafer W.

The plate shaped dielectric 194 is disposed opposite to the placing table PD above the placing table PD. The lower electrode LE and the plate shaped dielectric 194 are provided substantially in parallel with each other. The processing space Sp is provided between the plate shaped dielectric 194 and the lower electrode LE. The processing space Sp is a space area for performing a plasma processing on the wafer W.

In the plasma processing apparatus 10, a deposition shield 46 is detachably provided along the inner wall of the processing container 192. The deposition shield 46 is also provided on the outer periphery of the support 14. The deposition shield 46 prevents an etching by-product (deposition) from adhering to the processing container 192, and may be formed by coating an aluminum material with a ceramic such as, for example, $Y_2O_3$. In addition to $Y_2O_3$, the deposition shield may be formed of a material containing oxygen such as, for example, quartz in an embodiment.

An exhaust plate 48 is provided on the side of the bottom portion of the processing container 192 and between the support unit 14 and the side wall of the processing container 192. The exhaust plate 48 may be formed by, for example, coating an aluminum material with a ceramic such as, for example, $Y_2O_3$. An exhaust port 12*e* is provided under the exhaust plate 48 inside the processing container 192. The exhaust device 50 is connected to the exhaust port 12*e* via an exhaust pipe 52. The exhaust device 50 includes a vacuum pump such as, for example, a turbo molecular pump, and is able to depressurize the space inside the processing container 192 to a desired degree of vacuum. The high frequency power supply 64 is a power supply that generates a high frequency power, that is, a high frequency bias power for drawing ions into the wafer W, and generates a high frequency bias power of a frequency in a range of from 400 kHz to 40.68 MHz, for example, a high frequency bias power of 13 MHz in an embodiment. The high frequency power supply 64 is connected to the lower electrode LE via the matching unit 68. The matching unit 68 is a circuit that matches an output impedance of the high frequency power supply 64 and an input impedance of a load side (the lower electrode LE side) each other.

On the ceiling portion of the processing container 192, the plate shaped dielectric 194 is provided opposite to the placing table PD. The plate shaped dielectric 194 is formed of, for example, quartz glass or a ceramic in an embodiment. Specifically, the plate shaped dielectric 194 is formed in, for example, a disk shape in an embodiment, and airtightly attached to close the opening formed in the ceiling portion of the processing container 192. The processing space Sp is a space where plasma is generated by the plasma source. The processing space Sp is a space where the wafer W is to be placed.

The processing container 192 is provided with a gas supply unit 120 that supplies a first gas G1, a second gas, a third gas, and a fourth gas to be described later. The gas supply unit 120 supplies the first to fourth gases to the processing space Sp described above. A gas inlet 121 is formed in the side wall portion of the processing container 192, and the gas supply source 122 is connected to the gas inlet 121 via a gas supply pipe 123. Flow rate controllers (e.g., a mass flow controller 124 and an opening/closing valve 126) are disposed in the intermediate of the gas supply pipe 123 to control the flow rates of the first to fourth gases. According to the gas supply unit 120, the first to fourth gases output from the gas supply source 122 are controlled to a flow rate preset by the mass flow controller 124, and supplied into the processing space Sp of the processing container 192 from the gas inlet 121.

For the simplification of descriptions, FIG. 4 represents the gas supply unit 120 by using a single gas line. However, the gas supply unit 120 has the configuration to supply the plurality of types of gases. While the gas supply unit 120 illustrated in FIG. 4 has the configuration to supply the gases from the side wall portion of the processing container 192 as an example, the gas supply unit 120 is not limited to the configuration illustrated in FIG. 4. For example, the gas supply unit 120 may have a configuration to supply the gases from the ceiling portion of the processing container 192. When the gas supply unit 120 has this configuration, the gas inlet may be formed at, for example, the central portion of the plate shaped dielectric 194, and the gases may be supplied from the gas inlet.

An exhaust device 50 is connected to the bottom portion of the processing container 192 via an exhaust pipe 52 to exhaust the atmosphere inside the processing container 192. The exhaust device 50 is configured by, for example, a vacuum pump and is able to make the pressure inside the processing container 192 be a preset pressure.

A wafer carry in/out port 134 is provided in the side wall portion of the processing container 192, and a gate valve 136 is provided in the wafer carry in/out port 134. For example, when the wafer W is carried in, the gate valve 136 is opened. After the wafer W is placed on the placing table PD inside the processing container 192 by a transfer mechanism such as, for example, a transfer arm (not illustrated), the gate valve 136 is closed, and a processing on the wafer W is started.

On the ceiling portion of the processing container 192, a planar high frequency antenna 140 and a shield member 160 that covers the high frequency antenna 140 are provided on the upper surface (outer surface) of the plate shaped dielectric 194. In an embodiment, the high frequency antenna 140 includes inner antenna elements 142A disposed at the central portion of the plate shaped dielectric 194 and outer antenna elements 142B disposed to surround the outer periphery of the inner antenna elements 142A. In an embodiment, each of the inner antenna elements 142A and the outer antenna elements 142B is, for example, a conductor such as, for example, copper, aluminum or stainless steel and has a spiral coil shape.

All of the inner antenna elements 142A and the outer antenna elements 142B are held by a plurality of holders 144 to be integrated with each other. Each holder 144 has, for example, a rod shape in an embodiment. The holders 144 are radially arranged to protrude from the vicinity of the center of the inner antenna elements 142A toward the outside of the outer antenna elements 142B.

The shield member 160 includes an inner shield wall 162A and an outer shield wall 162B. The inner shield wall 162A is provided between the inner antenna elements 142A and the outer antenna elements 142B to surround the inner antenna elements 142A. The outer shield wall 162B is provided to surround the outer antenna elements 142B, and has a cylindrical shape. Accordingly, the upper side surface of the plate shaped dielectric 194 is divided into an inner central portion (central zone) inside the inner shield wall 162A and a peripheral portion (peripheral zone) between the inner shield wall 162A and the outer shield wall 162B.

A disk shaped inner shield plate 164A is provided on the inner antenna elements 142A to close the opening of the inner shield wall 162A. A doughnut-plate shaped outer shield plate 164B is provided on the outer antenna elements 142B to close the opening between the inner shield wall 162A and the outer shield wall 162B.

The shape of the shield member 160 is not limited to the cylindrical shape. In an embodiment, the shield member 160 may have another shape such as, for example, an angular cylindrical shape or may be adapted to the shape of the processing container 192. Here, since the processing container 192 has, for example, the substantially cylindrical shape in an embodiment, the shield member 160 also has the substantially cylindrical shape which is adapted to the cylindrical shape of the processing container 192. In a case where the processing container 192 has a substantially angular cylindrical shape, the shield member 160 also has the substantially angular cylindrical shape.

The high frequency power supplies 150A and 150B are connected to the inner antenna elements 142A and the outer antenna elements 142B, respectively. Accordingly, high frequency waves of the same frequency or different frequencies may be applied to the inner antenna elements 142A and the outer antenna elements 142B, respectively. For example, when a high frequency wave of a frequency of, for example, 27 MHz in an embodiment is supplied from the high frequency power supply 150A to the inner antenna elements 142A with a preset power W, a gas introduced into the processing container 192 may be excited by an induction magnetic field formed inside the processing container 192, and plasma may be generated in a doughnut shape at the central portion on the wafer W. In addition, when a high frequency wave of a frequency of, for example, 27 MHz in an embodiment is supplied from the high frequency power supply 150B to the inner antenna elements 142B with a preset power W, a gas introduced into the processing container 192 may be excited by an induction magnetic field formed inside the processing container 192, and plasma may be separately generated in a doughnut shape at the peripheral portion on the wafer W. The high frequency wave output from each of the high frequency power supplies 150A and 150B is not limited to the frequency described above, and high frequency waves of various frequencies may be supplied from each of the high frequency power supplies 150A and 150B. In addition, it is necessary to adjust the electrical lengths of the inner antenna elements 142A and the outer antenna elements 142B according to the high frequencies output from the high frequency power supplies 150A and 150B, respectively. The heights of the inner shield plate 164A and the outer shield plate 164B may be individually adjusted by actuators 168A and 168B, respectively.

Figure 6:
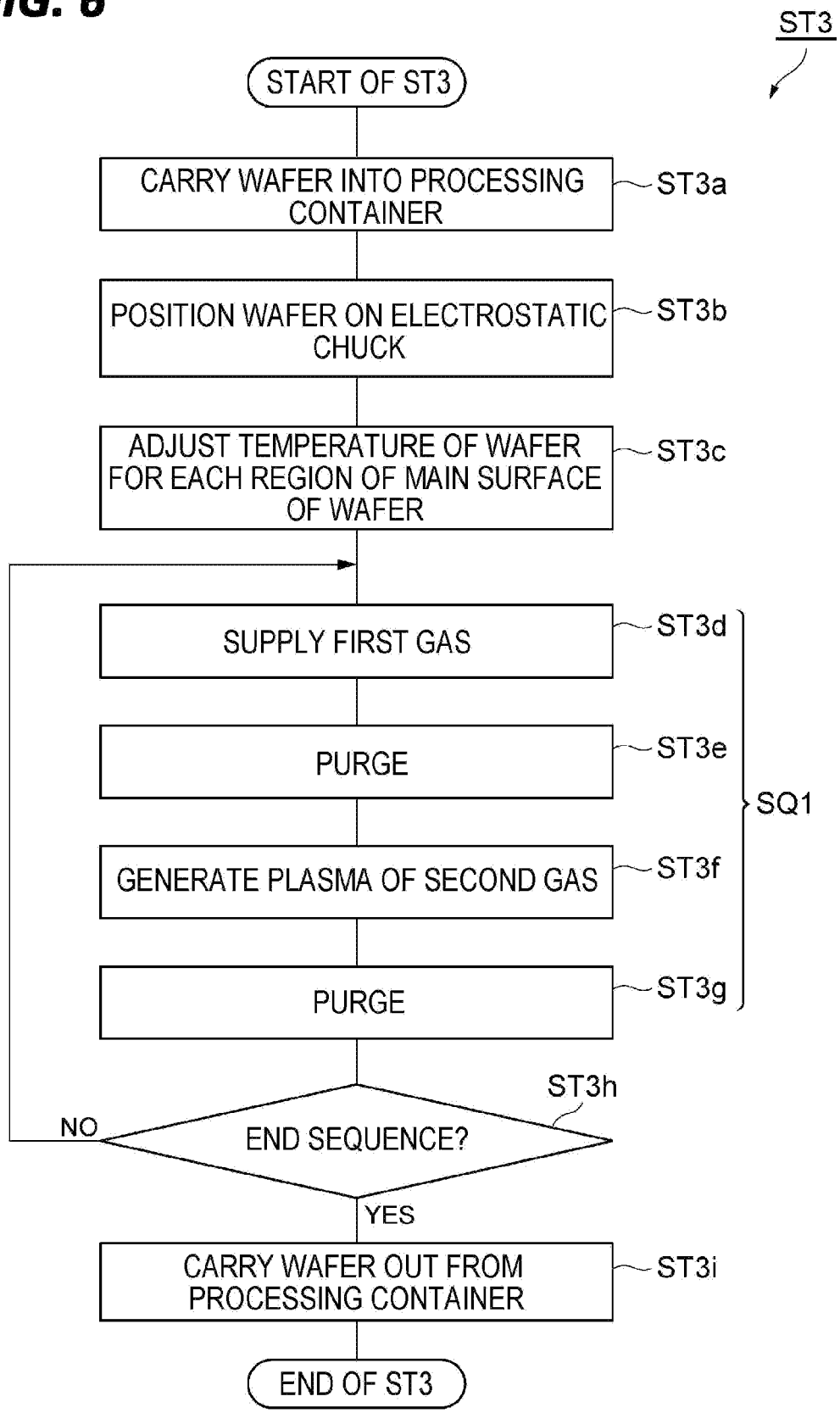
FIG. 6 is a flowchart illustrating an example of a process included in the method illustrated in FIG. 1 and relating to adjusting a deviation of a trench width.

Hereinafter, with reference to, for example, FIGS. 1, 6, and 10, the method MT will be described in detail by using an example where the method MT is implemented in the processing system 1 including the plasma processing apparatus 10. In addition, the method MT may be implemented in another processing system different from the processing system 1, and such a processing system may include a plasma processing apparatus other than the plasma processing apparatus 10.

Figure 5:
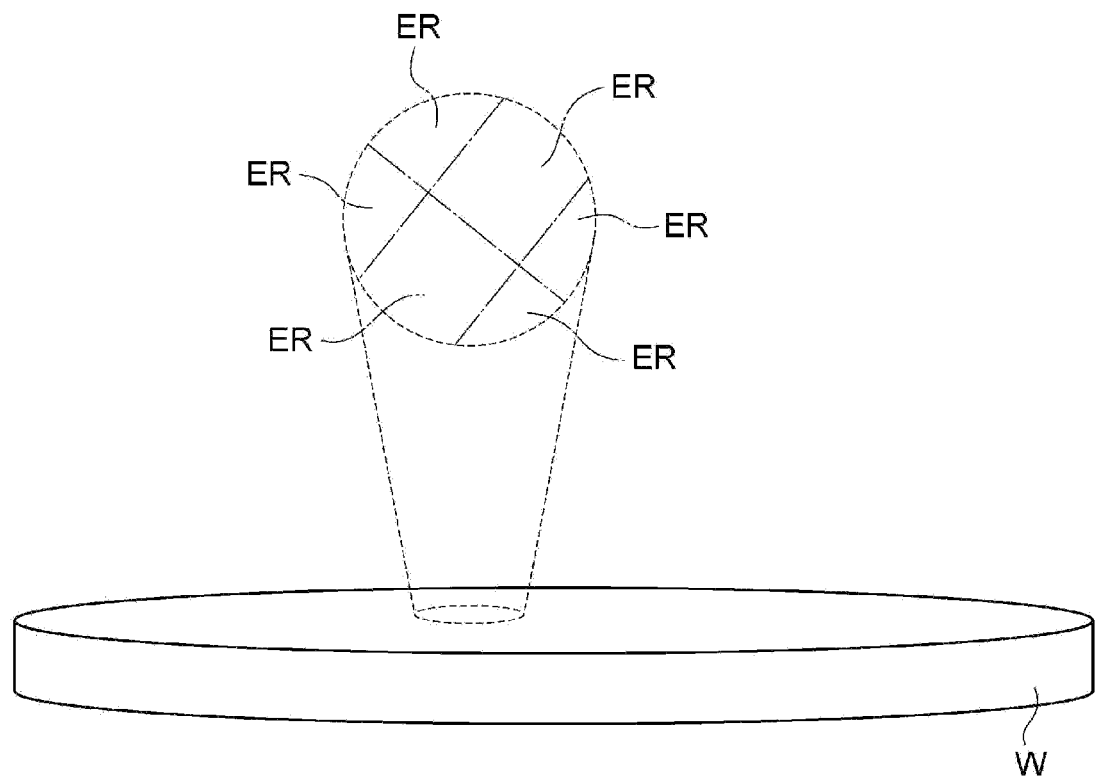
FIG. 5 is a view schematically illustrating a part of a plurality of regions, on the main surface of the workpiece, which are divided in a process illustrated in FIG. 1.

First, referring back to FIG. 1, the method MT includes a basic process. The basic process includes steps ST1 (first process), ST2, ST3 (second process), ST4, and ST5 (third process). As illustrated in FIG. 1, the basic process returns to step ST1 after the performance of step ST3 and after the performance of step ST5. Step ST1 measures the trench widths of the plurality of trenches of the wafer W (including the trenches TR1 and TR2; the same applies hereinafter). More specifically, in step ST1, the controller Cnt measures a value of the trench width for each of the trenches TR1 and TR2 and for each of the plurality of regions ER on the surface of the wafer W, by using the optical observation apparatus OC of the processing system 1. In the method MT (the processing performed by the controller Cnt), the surface of the wafer W is divided into the plurality of regions ER as illustrated in FIG. 5. FIG. 5 is a view schematically illustrating an example of a part of the plurality of regions ER on the surface of the wafer W which are divided in the method MT according to an embodiment. The plurality of regions ER does not overlap with each other. The plurality of regions ER covers the surface of the wafer W. As for the shape of the regions ER, in an embodiment, the regions ER may be, for example, regions extending substantially concentrically with the center of the surface of the wafer W or lattice shaped regions, but are not limited to these shapes.

In step ST2 subsequent to step ST1, the controller Cnt calculates a differential value between the trench width measured for each region ER in step ST1 and a reference value of the trench width which is preset for each region ER (the reference value is individually preset for each of the trenches TR1 and TR2, but will be collectively simply referred to as the "reference value" for the simplification of descriptions), and a deviation of the trench width measured in step ST1 on the surface of the wafer W (more specifically, for example, a deviation of the differential value described above on the surface of the wafer W, in an embodiment). Then, the controller Cnt determines whether the deviation is within a preset reference range (the reference range is individually set for each of the trenches TR1 and TR2, but will be collectively simply referred to as the "reference range" for the simplification of descriptions). The deviation refers to a deviation of the measurement value of the trench width of each of the trenches TR1 and TR2 which is measured for each region ER in step ST1, and for example, a standard deviation may be used in an embodiment. The deviation indicates the uniformity of the trench width of each of the trenches TR1 and TR2 in the plane of the wafer W, and in an embodiment, more specifically, the deviation is represented by a standard deviation of the values of the trench widths of all the trenches TR1 in the plane of the wafer W and a standard deviation of the values of the trench widths of all the trenches TR2 in the plane of the wafer W.

As for the reference range of the deviation in each of the trenches TR1 and TR2, a single range may be used in each of the trenches TR1 and TR2, or a plurality of ranges may be used in each of the trenches TR1 and TR2. The plurality of reference ranges may be used, for example, in a case where the method MT illustrated in FIG. 1 is repeatedly performed. In this case, a different reference range may be used each time the method MT is performed. The case where the method MT is repeatedly performed will be described in detail later.

In step ST2, when it is determined that the deviation of the trench width of the trench TR1 in the plane of the wafer W on the surface of the wafer W and the deviation of the trench width of the trench TR2 in the plane of the wafer W on the surface of the wafer W are not within their respective reference ranges (step ST2: NO), the process proceeds to step ST3. When it is determined that the deviation of the trench width of the trench TR1 in the plane of the wafer W and the deviation of the trench width of the trench TR2 in the plane of the wafer W are within their respective reference ranges (step ST2: YES), the process proceeds to step ST4.

In step ST3 subsequent to ST2: NO, a process of adjusting the deviation of the trench width on the surface of the wafer W is performed. In step ST3, when the deviation of the trench width measured in step ST1 on the surface of the wafer W is not within the preset reference range (step ST2: NO), the deviation is adjusted by adjusting the trench width. In step ST3, the adjustment of the deviation of the trench width on the surface of the wafer W is implemented by forming a film (film LA illustrated in, for example, FIG. 9) on the surface of the wafer W (especially, in each trench) so as to reduce the deviation. The details of step ST3 will be described later with reference to FIG. 6. After the performance of step ST3, the process returns to step ST1 to repeat step ST1 and its subsequent processings.

In step ST4 subsequent to ST2: YES, after the reduction of the deviation of the trench width on the surface of the wafer W, it is determined whether the trench width is narrower than the reference width preset for each of the trenches TR1 and TR2. When it is determined that the trench width of at least one of the trenches TR1 and TR2 is narrower than the reference width (step ST4: YES), the process proceeds to step ST5. When it is determined that the trench widths of both the trenches TR1 and TR2 are equal to or larger than the reference width (step ST4: NO), the processing of the method MT is ended.

In ST5 subsequent to ST4: YES, when the deviation measured in step ST1 on the surface of the wafer W is within the reference range, and the trench width measured in step ST1 is narrower than the preset reference width in at least one of the trenches TR1 and TR2, an etching processing for expanding the trench width is performed. More specifically, in step ST5, an isotropic etching is performed on the film formed on the surface of the wafer W in step ST3, so as to uniformly expand the trench width. The etching amount of the etching in step ST5 (the thickness of the portion etched in step ST5, in the film formed on the surface of the wafer W in step ST3) is uniform (substantially the same) in all the trenches. The details of step ST5 will be described later with reference to FIG. 10. After the performance of step ST5, the process returns to step ST1 to repeat step ST1 and its subsequent processings.

Next, step ST3 will be described with reference to FIG. 6. FIG. 6 is a flowchart illustrating an example of step ST3 included in the method MT illustrated in FIG. 1 and relating to adjusting the deviation of the trench width. Step ST3 includes steps ST3$a$, ST3$b$, and ST3$c$ (fourth process), sequence SQ1 (first sequence), and steps ST3$h$ and ST3$i$. In step ST3$c$, the temperature of the surface of the wafer W is adjusted for each of the plurality of regions ER. In a film formation processing (fifth process) of sequence SQ1 and step ST3$h$ that are subsequent to step ST3$c$, a film formation processing is performed to form the film LA on the inner surfaces of the trenches of the wafer W by using an atomic layer deposition (ALD) method on the surface of the wafer W after the adjustment of the temperature. Sequence SQ1 includes steps ST3$d$ (sixth process), ST3$e$ (seventh process), ST3$f$ (eighth process), and ST3$g$ (ninth process).

More specifically, in step ST3$a$ subsequent to step ST2: NO (FIG. 1), the wafer W is moved from the optical observation apparatus OC to the plasma processing apparatus 10 and carried into the processing container 192 of the plasma processing apparatus 10 by the transfer robots Rb1 and Rb2. In step ST3$b$ subsequent to step ST3$a$, the wafer W carried into the processing container 192 of the plasma processing apparatus 10 is placed and positioned on the electrostatic chuck ESC.

Figure 7:
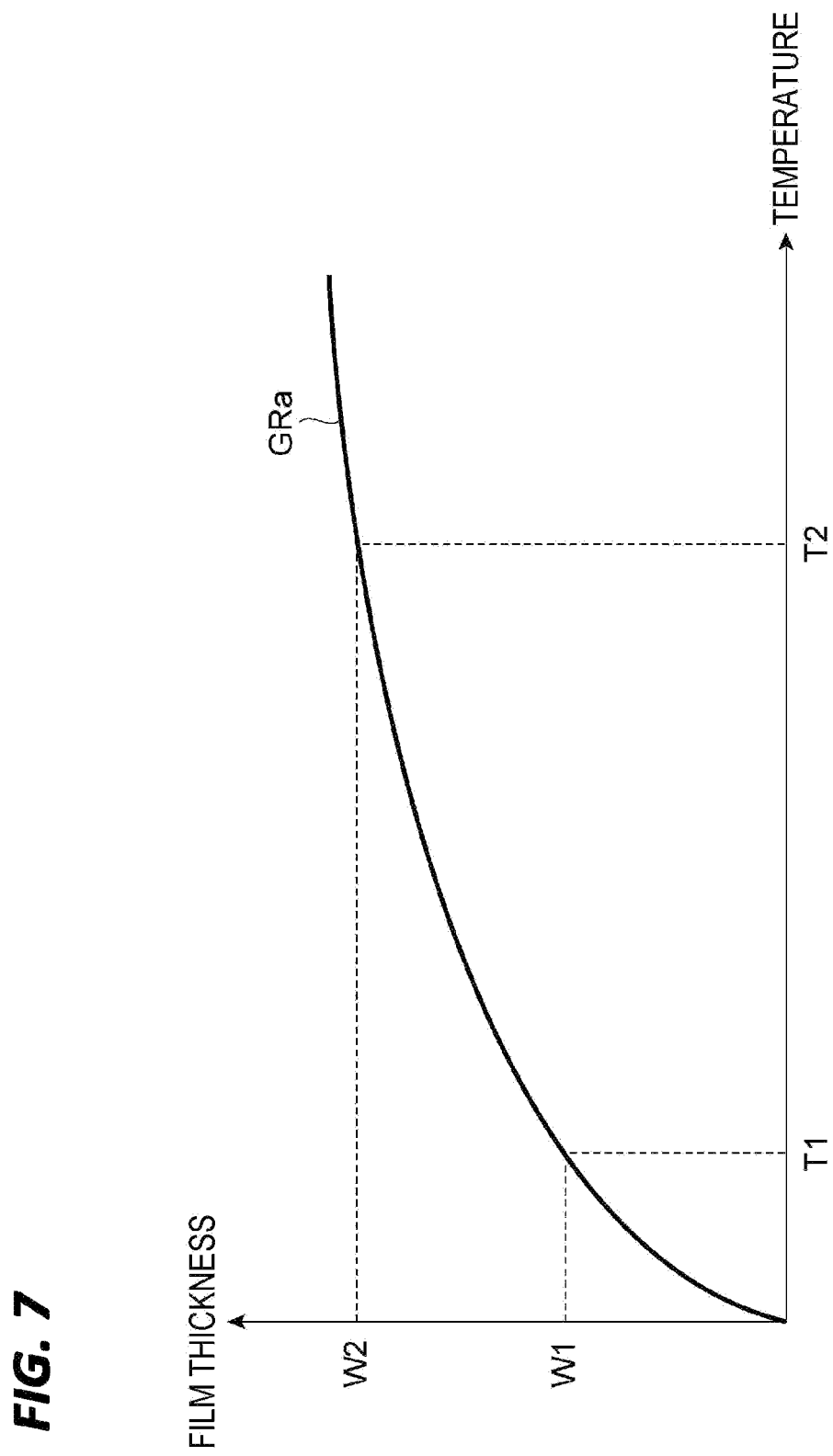
FIG. 7 is a view schematically illustrating a relationship between a film thickness of a film formed in a process illustrated in FIG. 6 and a temperature of the workpiece.

The film thickness of the film to be formed in the film formation processing of sequence SQ1 and step ST3$h$ which are performed after step ST3$c$ increases or decreases according to the temperature of the surface of the wafer W. Thus, in step ST3$c$ subsequent to step ST3$b$, the temperature of the surface of the wafer W is adjusted for each of the plurality of regions ER by using the temperature regulator HT. FIG. 7 is a view schematically illustrating a relationship between the film thickness of the film formed in the steps illustrated in FIG. 6 and the temperature of the surface of the wafer W. A curve GRa illustrated in FIG. 7 represents the correspondence between the film thickness of the film formed in the steps illustrated in FIG. 6 and the temperature of the surface of the wafer W on which the film is formed, and corresponds to the Arrhenius equation (Arrhenius plot). The horizontal axis of FIG. 7 indicates the temperature of the surface of the wafer W on which the film is formed by step ST3. The vertical axis of FIG. 7 indicates the film thickness of the film formed in step ST3. Especially, the film thickness indicated on the vertical axis of FIG. 7 is the thickness of the film formed for a time equal to or longer than the time for reaching the self-limited region in the ALD method used in step ST3. As illustrated in FIG. 7, when the temperature of the surface of the wafer W is a value T1, the film thickness of the film formed on the surface of the wafer W is a value W1, and when the temperature of the surface of the wafer W is a value T2 (T2>T1), the film thickness of the film formed on the surface of the wafer W is a value W2 (W2>W1). Thus, when the ALD method is used, the film thickness formed on the surface may be made thick as the temperature of the surface temperature increases. Accordingly, when the film formation processing of sequence SQ1 and step ST3$h$ is performed after the temperature of the surface of the wafer W is adjusted in step ST3$c$, the deviation of the trench width of each of the trenches TR1 and TR2 on the surface of the wafer W may be reduced by the film formed by the film formation processing (the in-plane uniformity is improved). In other words, the adjustment of the temperature of the surface of the wafer W in step ST3$c$ is performed so as to cause the deviation of the trench width of each of the trenches TR1 and TR2 on the surface of the wafer W to be reduced by the film formed by the film formation processing of sequence SQ1 and step ST3h which are performed after step ST3c.

In step ST3c, the controller Cnt adjusts the temperature of the surface of the wafer W for each of the plurality of regions ER so as to reduce the deviation of the trench width of each of the trenches TR1 and TR2 on the surface of the wafer W by the formation of the film described above, using pre-obtained correspondence data DT which represents the correspondence between the temperature of the surface of the wafer W and the film deposited on the inner surfaces of the trenches (the film formed by the film formation processing of sequence SQ1 and step ST3h and included in the film LA) in the film formation processing of sequence SQ1 and step ST3h. The correspondence data DT is obtained in advance by depositing a film on the inner surfaces of the trenches provided in the surface MK1 of the mask MK and the mask MK (the film LA illustrated in, for example, FIG. 9), based on the same conditions as used in the film formation processing of sequence SQ1 and step ST3h (the conditions excluding the temperature of the surface of the wafer W), for each temperature of the surface of the wafer W. The correspondence data DT is stored in the storage unit of the controller Cnt to be readable. That is, in step ST3c, the controller Cnt adjusts the temperature of the surface of the wafer W for each of the plurality of regions ER by using the temperature regulator HT and the correspondence data DT, such that the temperature of each of the plurality of regions ER on the surface of the wafer W carried into the processing container 192 becomes the temperature corresponding to the film thickness of the differential value calculated for each of the plurality of regions ER in step ST2. By performing the film formation processing of sequence SQ1 and step ST3h on the surface of the wafer W of which temperature has been adjusted by step ST3c (including the surface MK1 and the inner surfaces of the trenches of the wafer W), the deviation of the trench width of each of the trenches TR1 and TR2 on the surface of the wafer W may be reduced.

As described above, the series of steps including sequence SQ1 and step ST3h which are subsequent to step ST3c relate to the film formation processing of forming a film (film LA) on the surface of the wafer W (the surface MK1 of the mask MK and the inner surfaces of the trenches of the wafer W) carried into the processing container 192. The film formation processing of sequence SQ1 and step ST3h is a process of forming a silicon oxide film (film LA) on the surface of the wafer W by using the same method as the ALD method so as to reduce the deviation of the trench width of each of the trenches TR1 and TR2 on the surface of the wafer W for each of the plurality of regions ER. During the performance of step ST3d of sequence SQ1, the temperature of the surface of wafer W adjusted for each of the plurality of regions ER in step ST3c is maintained. Thus, while the film (film LA) formed by the film formation processing may have a different film thickness for each of the plurality of regions ER (more specifically, for example, for each of the central portion, the intermediate portion, and the end portion of the surface of the wafer W), the deviation of the trench width of each of the trenches TR1 and TR2 on the surface of the wafer W may be reduced.

Figure 8A:
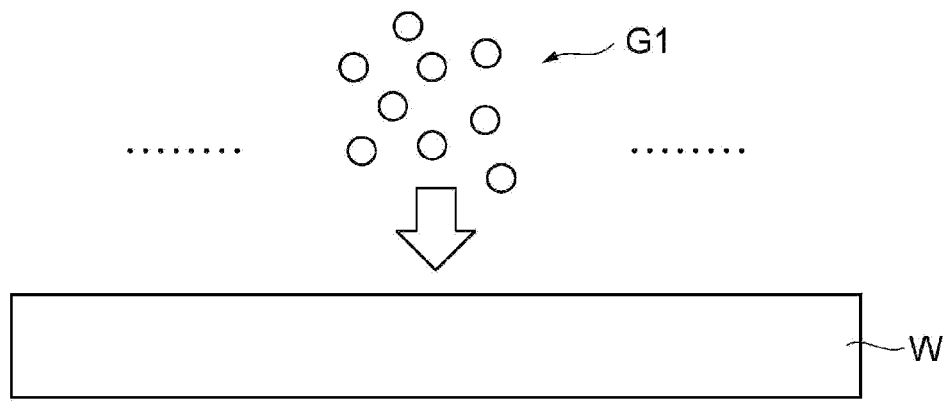
FIGS. 8A to 8C are views illustrating the principle of the film formation in the process illustrated in FIG. 6.

The details of the film formation processing (sequence SQ1 and step ST3h) will be described. In step ST3d, the first gas G1 is supplied into the processing container 192. Specifically, in step ST3d, as illustrated in FIG. 8A, the first gas G1 containing silicon is introduced into the processing container 192.

The first gas G1 includes an organic group-containing aminosilane-based gas. The first gas G1 is an aminosilane-based gas, and a gas having a molecular structure with a relatively small number of amino groups may be used. In an embodiment, for example, monoaminosilane ($H_3$—Si—R (R is an amino group which contains an organic group and may be substituted)) may be used. In addition, the aminosilane-based gas used as the first gas G1 may include aminosilane which may have 1 to 3 silicon atoms, or aminosilane having 1 to 3 amino groups. The aminosilane having 1 to 3 silicon atoms may be monosilane (monoaminosilane) having 1 to 3 amino groups, disilane having 1 to 3 amino groups, or trisilane having 1 to 3 amino groups. In addition, the aminosilane may have an amino group which may be already substituted. In addition, the amino group may be substituted by any of a methyl group, an ethyl group, a propyl group, and a butyl group. In addition, the methyl group, the ethyl group, the propyl group or the butyl group may be substituted by halogen. The first gas G1 which is the organic group-containing aminosilane-based gas is supplied into the processing container 192 from a gas source selected from a plurality of gas sources of the gas supply source 122. The processing time in step ST3d is equal to or longer than the time for reaching the self-limited region of the ALD method.

Figure 8B:
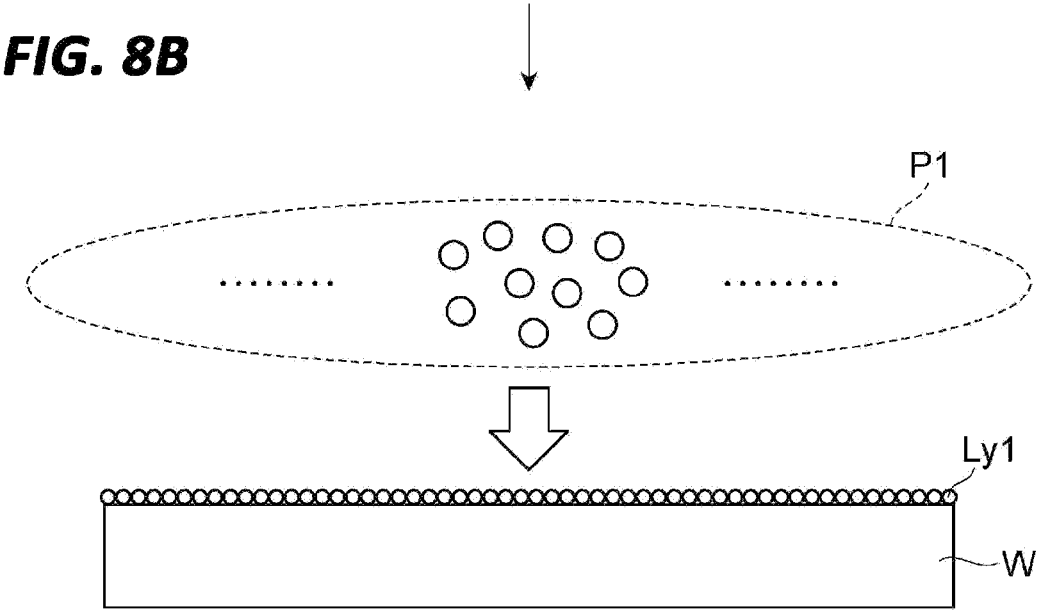

As illustrated in FIG. 8B, the molecules of the first gas G1 are attached as a reaction precursor (layer Ly1) to the surface of the wafer W (the surface MK1 of the mask MK and the inner surfaces of the trenches of the wafer W). In step ST3d, plasma of the first gas G1 is not generated. The molecules of the first gas G1 are attached to the surface of the wafer W by a chemical adsorption based on a chemical bonding, and plasma is not used. As for the first gas G1, any gas may be used as long as the gas can be attached to the surface of the wafer W by the chemical bonding based on the temperature adjusted for each of the plurality of regions ER in step ST3c, and contains silicon.

Meanwhile, for example, when monoaminosilane is selected as the first gas G1, the reason for the selection of monoaminosilane is further found in that monoamino silane has a relatively high electronegativity and has a molecular structure having a polarity so that the chemical adsorption can be relatively easily performed. The layer Ly1 of the reaction precursor formed by the attachment of the molecules of the first gas G1 to the surface of the wafer W becomes a state close to a monomolecular layer (single layer) because the attachment is the chemical adsorption. As the amino group R of the monoaminosilane is small, the molecular structure of the molecules adsorbed to the surface of the wafer W also becomes small. Thus, the steric hindrance caused by the size of the molecules is reduced, so that the molecules of the first gas G1 may be uniformly adsorbed to the surface of the wafer W for each of the plurality of regions ER according to the temperatures of the regions ER, and the layer Ly1 may be formed with the uniformly film thickness on the surface of the wafer W for each of the plurality of regions according to the temperatures of the regions ER.

As described above, since the first gas G1 includes the organic-group containing aminosilane-based gas, the reaction precursor (layer Ly1) of silicon is formed along the atomic layer on the surface of the wafer W by step ST3d.

In step ST3e subsequent to step ST3d, the processing space Sp inside the processing container 192 is purged.

Specifically, the first gas G1 supplied in step ST3d is exhausted. In step ST3e, an inert gas such as, for example, nitrogen gas or rare gas (e.g., Ar in an embodiment) may be supplied as the purge gas into the processing container 192. That is, in step ST3e, the purging may be either a gas purging to flow the inert gas into processing container 192 or a purging by evacuation. In step ST3e, the molecules excessively attached to the surface of the wafer W may also be removed. In this way, the layer Ly1 of the reaction precursor becomes a very thin molecular layer that is formed according to the temperatures of the regions ER on the surface of the wafer W.

In step ST3f subsequent to step ST3e, as illustrated in FIG. 8B, plasma P1 of the second gas is generated inside the processing space Sp of the processing container 192. The second gas includes a gas containing oxygen atoms and may include, for example, oxygen gas in an embodiment. The second gas including the gas containing oxygen atoms is supplied into the processing container 192 from a gas source selected from the plurality of gas sources of the gas supply source 122. Then, the high frequency power is supplied from the high frequency power supplies 150A and 150B. The exhaust device 50 is operated so that the pressure in the processing space Sp inside the processing container 192 is set to a preset pressure. In this way, the plasma P1 of the second gas is generated in the processing space Sp.

Figure 8C:
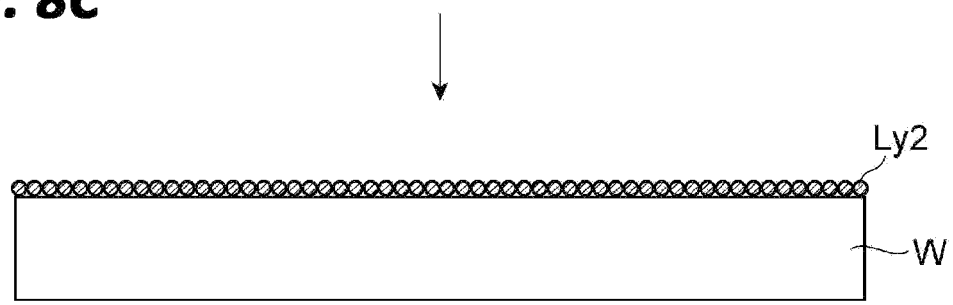

When the plasma P1 of the second gas is generated as illustrated in FIG. 8B, active species of oxygen, for example, oxygen radicals in an embodiment are generated, and as illustrated in FIG. 8C, a layer Ly2 which is a silicon oxide film (a layer included in the film LA of, for example, FIG. 9) is formed as a very thin molecular layer.

As described above, since the second gas includes oxygen atoms, the oxygen atoms are bonded to the reaction precursor (layer Ly1) of silicon provided on the surface of the wafer W in step ST3f, so that the layer Ly2 of the silicon oxide film (the layer included in the film LA of, for example, FIG. 9) may be formed with a different film thickness for each of the plurality of regions ER according to the temperatures of the regions ER. Accordingly, in sequence SQ1, the layer Ly2 of the silicon oxide film (the layer included in the film LA of, for example, FIG. 9) may be formed with a film thickness according to the temperature of each of the plurality of regions ER on the surface of the wafer W by using the same method as the ALD method.

In step ST3g subsequent to step ST3f, the processing space Sp inside the processing container 192 is purged. Specifically, the second gas supplied in step ST3f is exhausted. In step ST3g, an inert gas such as, for example, nitrogen gas or rare gas (e.g., Ar in an embodiment) may be supplied as the purge gas into the processing container 192. That is, in step ST3g, the purging may be either a gas purging to flow the inert gas into the processing container 192 or a purging by evacuation.

In step ST3h subsequent to sequence SQ1, it is determined whether the number of repeating times of sequence SQ1 reaches the preset number of times. When it is determined that the number of repeating times of sequence SQ1 does not reach the preset number of times (step ST3h: NO), sequence SQ1 is performed again, and when it is determined that the number of repeating times of sequence SQ1 reaches the preset number of times (step ST3h: YES), the process proceeds to step ST3i. That is, in step ST3h, the performance of sequence SQ1 is repeated until the number of repeating times of sequence SQ1 reaches the preset number of times, so that the film having the film thickness according to the temperature of each of the plurality of regions ER is formed for each of the plurality of regions ER on the surface of the wafer W. The number of repeating times of sequence SQ1 that is controlled by step ST3h is set such that among the plurality of trenches provided on the surface of the wafer W, a trench having the smallest trench width is not clogged by the film formed by the film formation processing in, for example, sequence SQ1 (at least the opening of the trench is not clogged), and has a trench width larger than the preset reference width.

Figure 9:
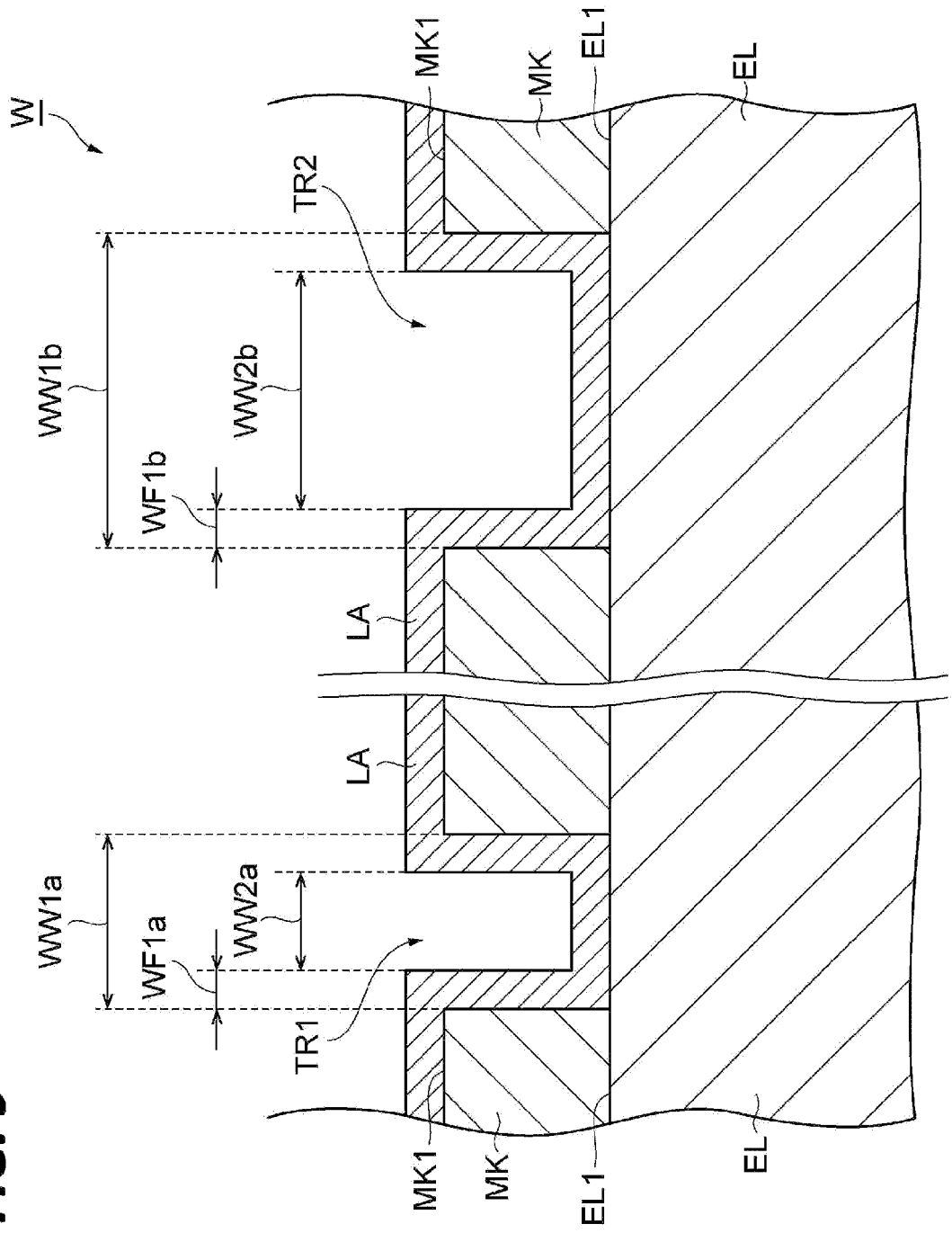
FIG. 9 is a cross-sectional view illustrating a state of the workpiece after the film formation in the process illustrated in FIG. 6.

As illustrated in FIG. 9, the film LA is formed on the surface of the wafer W (the surface MK1 of the mask MK and the inner surfaces of the trenches of the wafer W) by the film formation processing of sequence SQ1 and step ST3h. After the formation of the film LA, the trench TR1 has the trench width WW2a, and the trench TR2 has the trench width WW2b. The value of the trench width WW2a after the formation of the film LA in the trench TR1 is smaller than the value of the trench width WW1a before the formation of the film LA, and the value of the trench width WW2b after the formation of the film LA in the trench TR2 is smaller than the value of the trench width WW1b before the formation of the film LA. The trenches TR1 and TR2 illustrated in FIG. 9 correspond to the trenches TR1 and TR2 illustrated in FIG. 2, respectively, and are both present in the same region ER (more specifically, for example, any of the central portion, the intermediate portion, and the end portion of the surface of the wafer W). The value of the film thickness WF1a of the film LA in the trench TR1 and the value of the film thickness WF1b of the film LA in the trench TR2 are substantially the same, regardless of the sizes of the trench widths.

In step ST3i subsequent to ST3h: YES, the wafer W is carried out from the plasma processing apparatus 10 to the optical observation apparatus OC and carried into the optical observation apparatus OC by the transfer robots Rb1 and Rb2. After step ST3i, step ST3 is ended, and the process returns to step ST1 to perform ST1 and its subsequent processings again.

Next, step ST5 will be described with reference to FIG. 10. FIG. 10 is a flowchart illustrating an example of step ST5 which is included in the method MT illustrated in FIG. 1 and relates to adjusting the trench width. Step ST5 includes steps ST5a and ST5b, sequence SQ2 (second sequence), and steps ST5g and ST5h. Sequence SQ2 includes steps ST5c (tenth step), ST5d (eleventh step), ST5e (twelfth step), and ST5f (thirteenth step). Sequence SQ2 and step ST5g are an etching processing for performing an etching using a surface modification with nitrogen gas through the same method as the ALE method so as to adjust the trench width to be expanded.

More specifically, in step ST5a subsequent to ST4: YES (FIG. 1), the wafer W is moved from the optical observation apparatus OC to the plasma processing apparatus and carried into the processing container 192 of the plasma processing apparatus 10 by the transfer robots Rb1 and Rb2. In step ST5b subsequent to step ST5a, the wafer W carried into the processing container 192 of the plasma processing apparatus 10 is placed and positioned on the electrostatic chuck ESC. Step ST5 may be performed by using a plasma processing apparatus different from the plasma processing apparatus 10 used for performing step ST3.

In sequence SQ2 subsequent to step ST5b, the film LA formed on the surface of the wafer W in step ST3 is isotropically and uniformly etched in all the trenches across the surface of the wafer W by the same method as the ALE method. An etching amount of the etching in sequence SQ2 (the thickness of the portion of the film LA which is etched in sequence SQ2) is uniform (substantially the same) in all the trenches across the surface of the wafer W. The series of sequence SQ2 and step ST5g are an etching processing for isotropically and uniformly etching the film LA formed on the surface of the wafer W in step ST3 in all the trenches across the surface of the wafer W so as to expand the trench widths of all of the trenches until the trench widths reach the preset reference width.

In step ST5c, plasma of the third gas is generated inside the processing container 192 of the plasma processing apparatus 10 in which the wafer W is accommodated, and a mixture layer MX including ions included in the plasma of the third gas is isotropically and uniformly formed on the atomic layer of the surface of the film LA (especially, the surface of the film LA formed in the inner surfaces of the trenches of the wafer W). In step ST5c, the mixture layer MX including the ions included in the plasma of the third gas may be isotropically and uniformly formed on the atomic layer of the surface of the film LA. In step ST5c, the third gas is supplied into the processing container 192, and the plasma of the third gas is generated, in a state where the wafer W is placed on the electrostatic chuck ESC. The third gas includes nitrogen and may include, for example, $N_2$ gas in an embodiment. Specifically, the third gas including $N_2$ gas is supplied into the processing container 192 from a gas source selected from the plurality of gas sources of the gas supply source 122. Then, the high frequency power is supplied from the high frequency power supplies 150A and 150B, a high frequency bias voltage is supplied from the high frequency power supply 64, and the exhaust device 50 is operated so that the pressure of the processing space Sp inside the processing container 192 is set to a preset value (set value).

Figure 11:
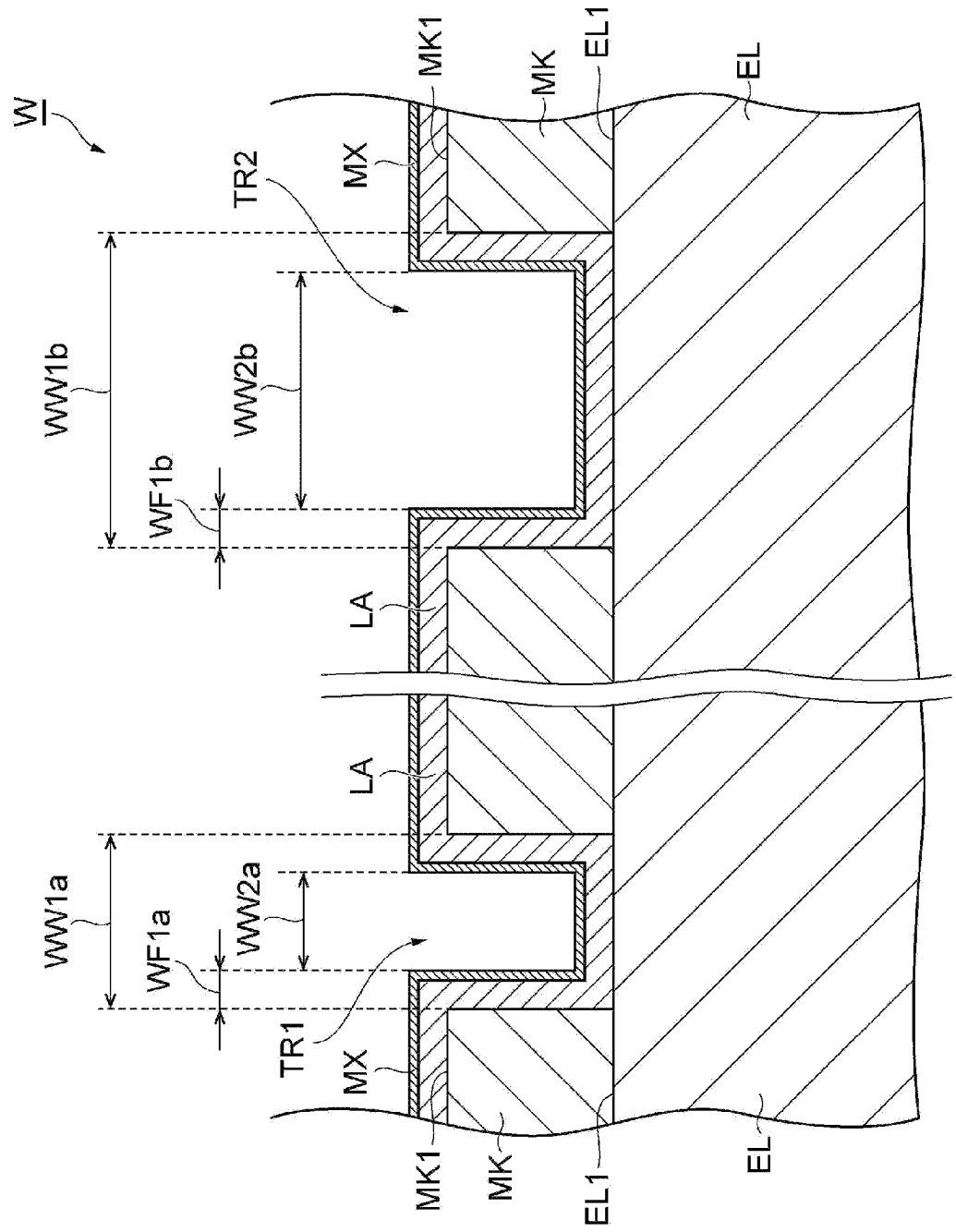
FIG. 11 is a cross-sectional view illustrating a state of the workpiece after a surface modification is performed in a process illustrated in FIG. 10.

In step ST5c, the set value of the pressure in the processing space Sp is relatively high, is equal to or higher than 200 mTorr, and may be, for example, 400 mTorr in an embodiment. When the pressure of the processing space Sp is relatively high as described above, the ions of the nitrogen atoms (hereinafter, referred to as "nitrogen ions") included in the plasma of the third gas are isotropically brought into contact with the surface of the film LA, and the surface of the LA is isotropically and uniformly modified by the nitrogen ions, so that as illustrated in FIG. 11, the mixture layer MX having a uniform (substantially the same) thickness is formed on the surface of the film LA across the surface of the wafer W. The trenches TR1 and TR2 illustrated in FIG. 11 correspond to the trenches TR1 and TR2 illustrated in FIG. 9, respectively, and are both present in the same region ER (more specifically, any of the central portion, the intermediate portion, and the end portion of the surface of the wafer W).

Figure 10:
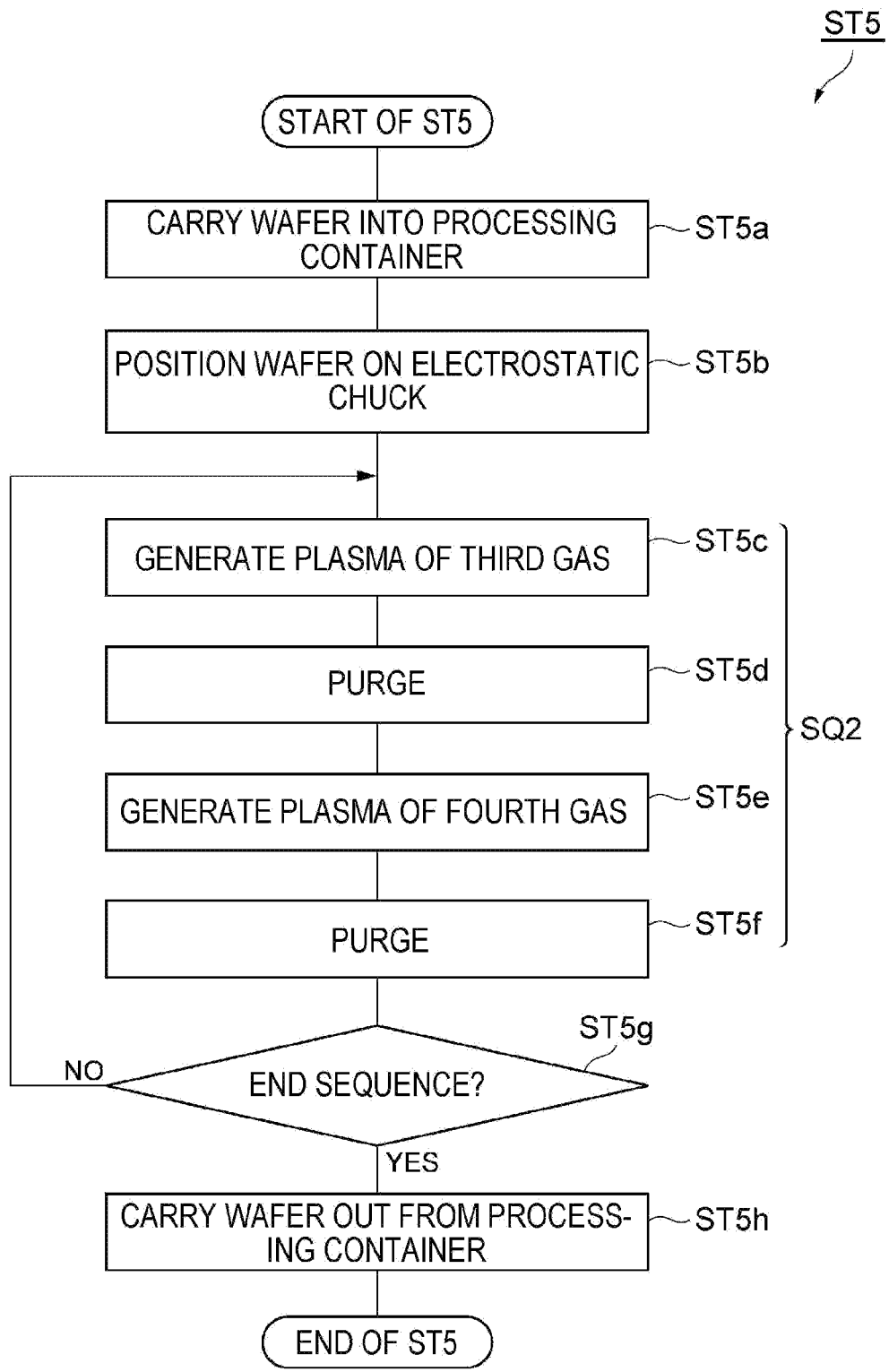
FIG. 10 is a flowchart illustrating an example of a process that may be included in the method illustrated in FIG. 1 and relates to adjusting a trench width.
Figure 12:
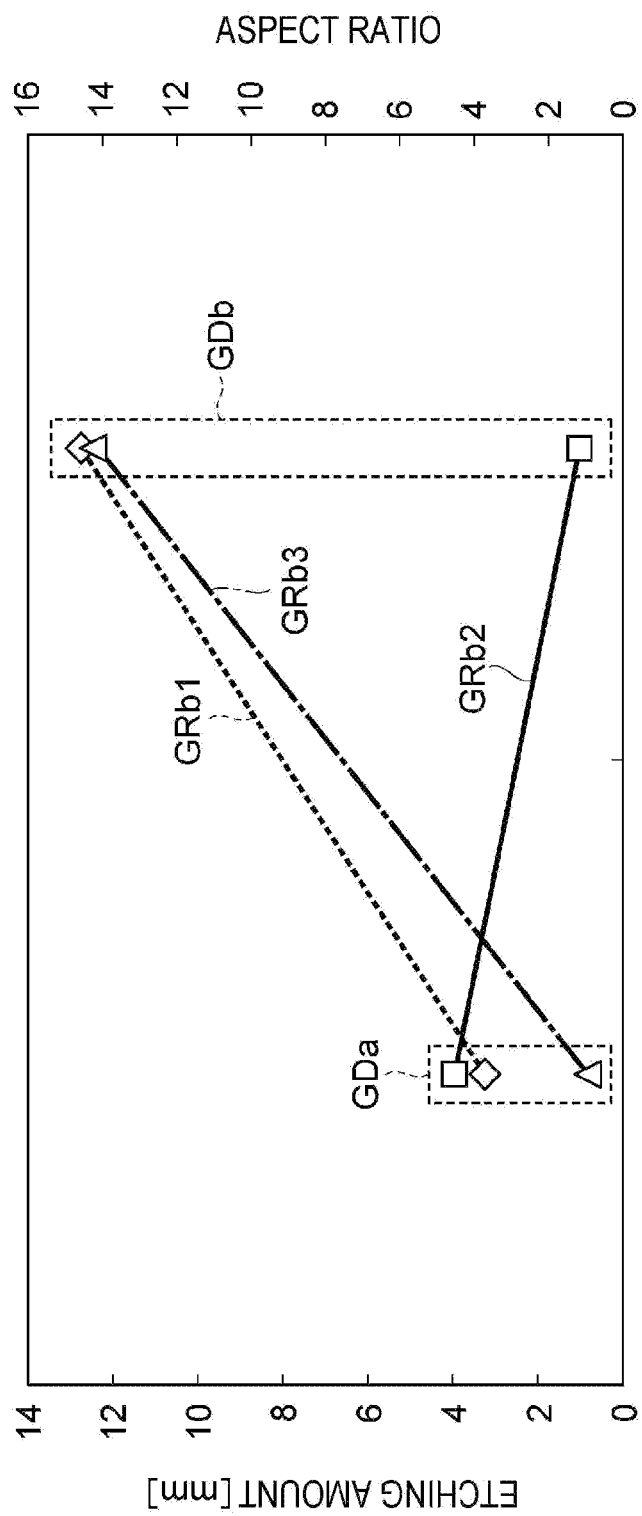
FIG. 12 is a view illustrating a situation that isotropy and anisotropy of an etching may be affected by a pressure in a sequence illustrated in FIG. 10.

FIG. 12 is a view illustrating the fact that the isotropy and the anisotropy of the etching in sequence SQ2 illustrated in FIG. 10 may be affected by the pressure. The left vertical axis of FIG. 12 indicates the etching amount (nm) (which is the thickness of the portion of the film LA surface-modified by step ST5c, and corresponds to the thickness of the portion of the film LA that may be removed by the etching of sequence SQ2 including step ST5c). The right vertical axis of FIG. 12 indicates an aspect ratio (a value obtained by dividing an etching amount of the bottom surface side (longitudinal) of a trench by an etching amount of the lateral surface side (transverse) of the trench). In FIG. 12, the line GRb1 represents a variation of the etching amount of the bottom surface side (longitudinal) of the trench, the line GRb2 represents a variation of the etching amount of the lateral surface side (transverse) of the trench, and the line GRb3 represents a variation of the value (aspect ratio) obtained by dividing the etching amount of the bottom surface side (longitudinal) of the trench by the etching amount of the lateral surface side (horizontal) of the trench. The result represented in the region GDa of FIG. 12 is obtained by performing step ST5c 30 times under a condition that the pressure of the processing space Sp is set to 400 mTorr, the value of the high frequency power is set to 600 W, the value of the high frequency bias power is set to 50 W, and the processing time is set to 30 s. The result represented in the region GDb of FIG. 12 is obtained by performing step ST5c 20 times under a condition that the pressure of the processing space Sp is set to 20 mTorr, the value of the high frequency power is set to 0 W, the value of the high frequency bias power is set to 50 W, and the processing time is set to 10 s. As illustrated in FIG. 12, when the pressure of the processing space Sp is relatively high with about 400 mTorr (the result represented in the region GDa), the isotropical etching may be implemented in sequence SQ2 by the surface modification using the ALE method.

Figure 13:
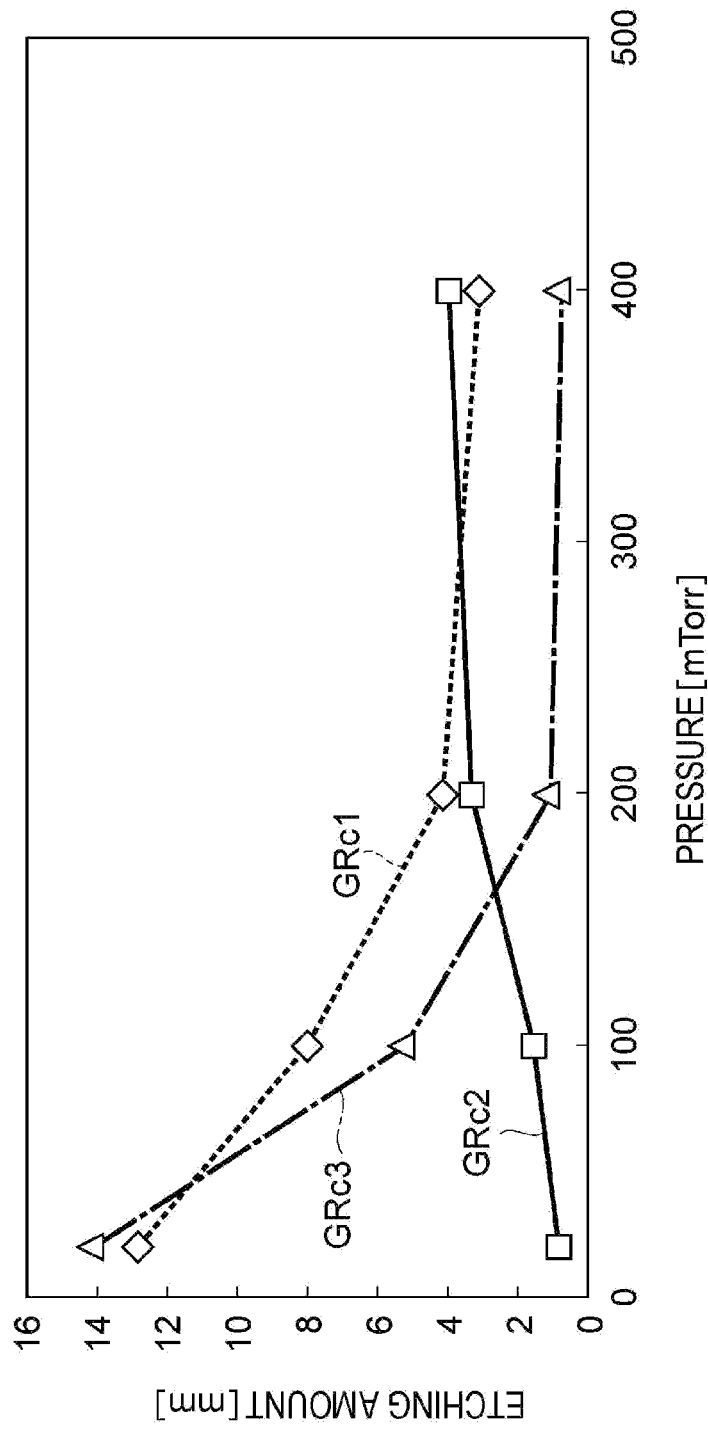
FIG. 13 is a view illustrating a relationship between the isotropy of the etching and the pressure in the sequence illustrated in FIG. 10.

The results represented in FIG. 12 will be confirmed in more detail with reference to FIG. 13. FIG. 13 is a view illustrating a relationship between the isotropy of the etching in sequence SQ2 illustrated in FIG. 10 and the pressure. The vertical axis of FIG. 13 indicates the etching amount (which is the thickness of the portion of the film LA surface-modified by step ST5c, and corresponds to the thickness of the portion of the film LA that may be removed by the etching of sequence SQ2 including step ST5c), and the horizontal axis of FIG. 13 indicates the pressure (mTorr) of the processing space Sp. In FIG. 13, the line GRc1 represents a variation of the etching amount of the bottom surface side (longitudinal) of a trench, the line GRc2 represents a variation of the etching amount of the lateral surface side (transverse) of the trench, and the line GRc3 represents a variation of the value (aspect ratio) obtained by dividing the etching amount of the bottom surface side (longitudinal) of the trench by the etching amount of the lateral surface side (transverse) of the trench. As illustrated in FIG. 13, when the pressure of the processing space Sp is relatively high with the pressure equal to or higher than 200 mTorr (e.g., about 400 mTorr in an embodiment), the isotropical etching may be sufficiently implemented in sequence SQ2 by the surface modification using the ALE method.

As described above, in step ST5c, the plasma of the third gas is generated inside the processing container 192, the nitrogen ions included in the plasma of the third gas are attracted vertically (in the direction from, for example, the side of the ceiling of the processing container 192 (specifically, for example, the side of the plate shaped dielectric 194) toward the surface of the wafer W placed on the electrostatic chuck ESC) by the high frequency bias power so as to be brought into contact with the surface of the film LA, and the surface of the film LA is isotropically modified. In this way, in step ST5c, the surface of the film LA becomes the mixture layer MX having the uniform thickness (substantially the same thickness) across the surface of the wafer W. Since the third gas includes nitrogen and the film LA includes silicon oxide (e.g., $SiO_2$ in an embodiment), the composition of the mixture layer MX may be, for example, $SiN/SiO_2(SiON)$ in an embodiment.

Figure 14:
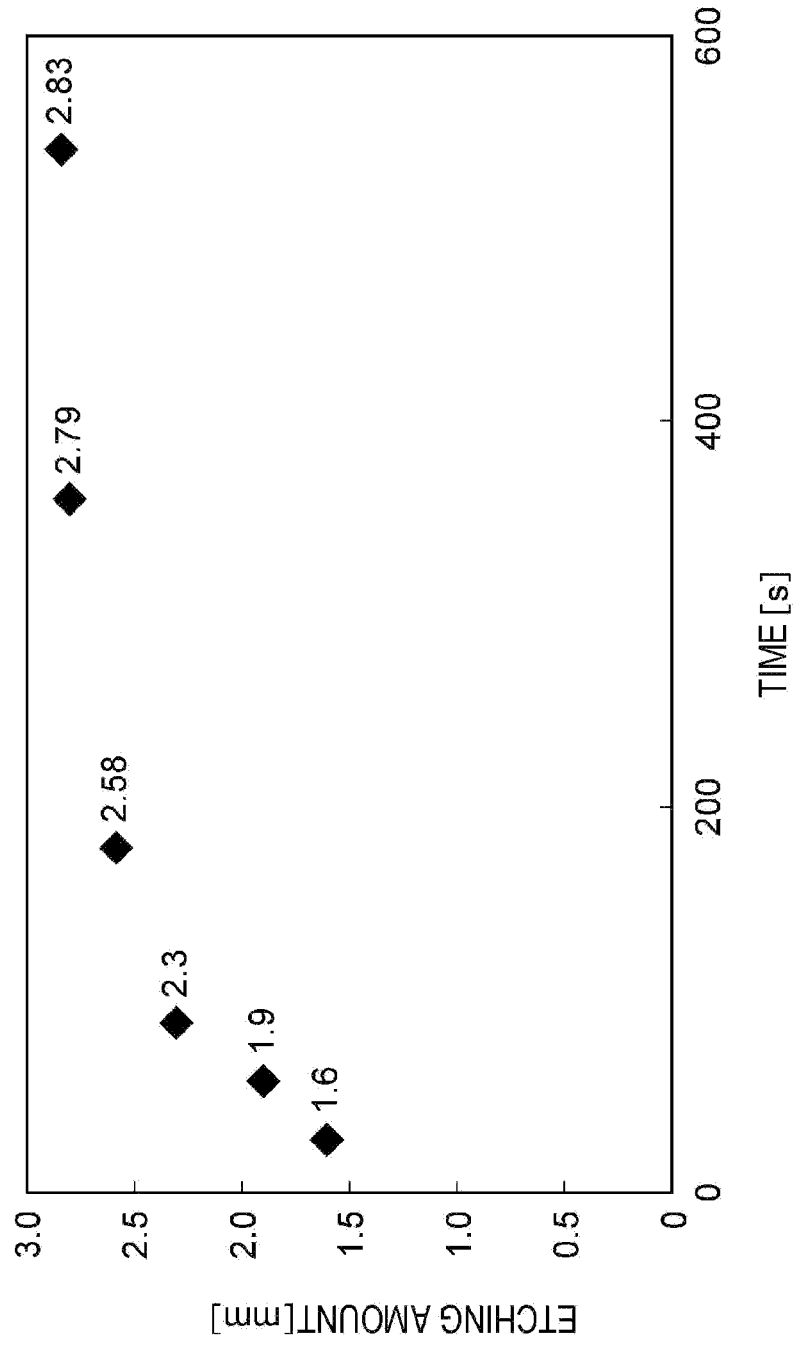
FIG. 14 is a view illustrating a self-limiting nature of the surface modification in the sequence illustrated in FIG. 10.

The processing time in step ST5c is equal to or longer than the time for reaching the self-limited region of the ALD method. FIG. 14 is a view illustrating the self-limiting nature of the surface modification in sequence SQ2 (in particular, step ST5c) illustrated in FIG. 10. The horizontal axis of FIG. 14 indicates the processing time (s) of the surface modification (more specifically, the processing performed in step ST5c), and the vertical axis of FIG. 14 indicates the etching amount (nm) (the thickness of the portion of the film LA surface-modified by step ST5c). The result represented in FIG. 14 is obtained by performing step ST5c under a condition that the pressure of the processing space Sp is set to 400 mTorr, the value of the high frequency power is set to 600 W, and the value of the high frequency bias power is set to 50 W. As illustrated in FIG. 14, the surface modification performed by step ST5c accompanies the self-limiting nature. That is, when the surface modification is performed for a time equal to or longer than the time for reaching the self-limited region of the ALE method, the surface modification is isotropically and uniformly implemented, regardless of the portion of the surface of the wafer W (more specifically, for example, the central portion, the intermediate portion or the end portion of the surface of the wafer W) and the sizes of the trench widths, so that the isotropical and uniform mixture layer MX may be constantly formed on the surface of the wafer W (the surface MK 1 of the mask MK and the inner surfaces of the trenches of the wafer W (including the trenches TR1 and TR2).

Figure 15C:
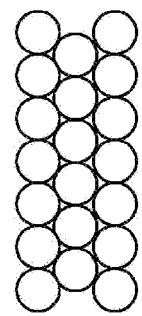
FIGS. 15A to 15C are views illustrating the principle of the etching in a process illustrated in FIG. 10.
Figure 15B:
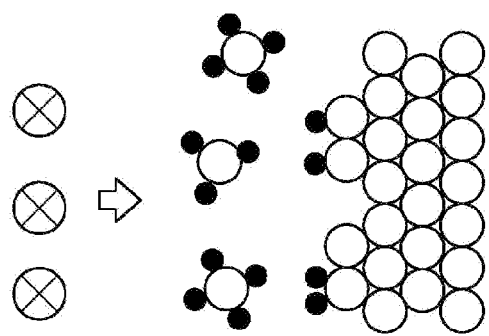
Figure 15A:
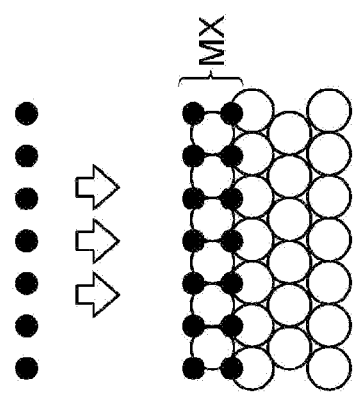

FIGS. 15A to 15C are views illustrating the principle of the etching in the steps illustrated in FIG. 10. In FIGS. 15A to 15C, white circles (open circles) indicate atoms constituting the film LA (e.g., atoms constituting $SiO_2$ in an embodiment), black circles (filled circles) indicate the nitrogen ions included in the plasma of the third gas, and circles with symbols "X" therein indicate radicals included in plasma of a fourth gas to be described later. As illustrated in FIG. 15A, the nitrogen ions (black circles (filled circles)) included in the plasma of the third gas are isotropically supplied to the atomic layer of the surface of the film LA by step ST5c. Accordingly, the mixture layer MX including the atoms constituting the film LA and the nitrogen atoms of the third gas is formed on the atomic layer of the surface of the film LA by step ST5c (also refer to FIG. 11 along with FIG. 15A).

As described above, since the third gas includes nitrogen, the nitrogen atoms are supplied to the atomic layer of the surface of the film LA (the atomic layer of silicon oxide) in step ST5c, and the mixture layer MX containing silicon nitride (e.g., $SiN/SiO_2$ in an embodiment) may be formed on the atomic layer of the surface of the film LA.

In step ST5d subsequent to step ST5c, the processing space Sp inside the processing container 192 is purged. Specifically, the third gas supplied in step ST5c is exhausted. In step ST5d, an inert gas such as, for example, nitrogen gas or rare gas (e.g., Ar in an embodiment) may be supplied as the purge gas into the processing container 192. That is, in step ST5d, the purging may be either a gas purging to flow the inert gas into processing container 192 or a purging by evacuation.

In step ST5e subsequent to step ST5d, the plasma of the fourth gas is generated inside the processing container 192, and the mixture layer MX is entirely removed by a chemical etching using the radicals included in the plasma. As a result, the film LA may be isotropically and uniformly etched across the surface of the wafer W (especially, the film LA provided on the inner surfaces of all the trenches). In step ST5e, the fourth gas is supplied into the processing container 192, and the plasma of the fourth gas is generated, in a state where the wafer W is placed on the electrostatic chuck ESC after the formation of the mixture layer MX in step S5c. The plasma of the fourth gas generated in step ST5e includes the radicals for removing the mixture layer MX including nitride of silicon. The fourth gas includes fluorine and may be, for example, a mixture gas including $NF_3$ gas and $O_2$ gas in an embodiment. In addition, the fourth gas may be, for example, a mixture gas including $NF_3$ gas, $O_2$ gas, $H_2$ gas, and Ar gas, or a mixture gas including $CH_3F$ gas, $O_2$ gas, and Ar gas. Specifically, the fourth gas is supplied into the processing container 182 from a gas source selected from the plurality of gas sources of the gas supply source 122, the high frequency power is supplied from the high frequency power supplies 150A and 150B, and the exhaust device 50 is operated so that the pressure of the processing space Sp inside the processing container 192 is set to a preset value. In this way, the plasma of the fourth gas is generated inside the processing container 192.

As illustrated in FIG. 15B, the radicals (the circles with symbols "X" therein in FIG. 15B) in the plasma of the fourth gas generated in step ST5e are brought into contact with the mixture layer MX on the surface of the film LA, and the radicals of the atoms of the fourth gas are supplied to the mixture layer MX formed on the surface of the film LA, so that the mixture layer MX may be removed from the film LA by the chemical etching.

As illustrated in FIGS. 15C and 16, the entire mixture layer MX formed on the surface of the film LA in step ST5c may be removed from the surface of the film LA by the radicals included in the plasma of the fourth gas. The value of the trench width WW3a of the trench TR1 after the removal of the mixture layer MX (FIG. 16) is larger than the value of the trench width WW2a of the trench TR 1 before the formation of the mixture layer MX (FIG. 9), and the value of the trench width WW3b of the trench TR2 after the removal of the mixture layer MX is larger than the value of the trench width WW2b of the trench TR2 before the formation of the mixture layer MX (FIG. 9). The value of the film thickness WF2a of the film LA in the trench TR1 after the removal of the mixture layer MX (FIG. 16) is smaller than the value of the film thickness WF1a of the film LA in the trench TR1 before the formation of the mixture layer MX (FIG. 9), and the value of the film thickness WF2b of the film LA in the trench TR2 after the removal of the mixture layer MX (FIG. 16) is smaller than the film thickness WF1b of the film LA in the trench TR2 before the formation of the mixture layer MX (FIG. 9). In addition, since the thickness of the mixture layer MX is uniform (substantially the same) in all the trenches provided on the surface of the wafer W, the value obtained by subtracting the value of the trench width WW2a of the trench TR1 (FIG. 9) from the value of the trench width WW3a of the trench TR1 (FIG. 16) is substantially the same as the value obtained by subtracting the value of the trench width WW2b of the trench TR2 (FIG. 9) from the value of the trench width WW3b of the trench TR2 (FIG. 16), and, and each of the values is substantially the same as the value twice the thickness of the mixture layer MX. Thus, by the removal of the mixture layer MX, the trenches TR1 and TR2 are expanded in the direction DR, and the trench widths are isotropically and uniformly expanded across the surface of the wafer W, regardless of the portion of the surface of the wafer W (more specifically, for example, the central portion, the intermediate portion or the end portion of the surface of the wafer W) and the sizes of the trench widths. In addition, the trenches TR1 and TR2 illustrated in FIG. 16 correspond to the trenches TR1 and TR2 illustrated in FIG. 9, respectively, and are both present in the same region (more specifically, for example, any of the central portion, the intermediate portion, and the end portion of the surface of the wafer W).

In step ST5f subsequent to step ST5e, the processing space Sp inside the processing container 192 is purged.

Specifically, the fourth gas supplied in step ST5e is exhausted. In step ST5f, an inert gas such as, for example, rare gas (e.g., Ar in an embodiment) may be supplied as the purge gas into the processing container 192. That is, in step ST5f, the purging may be either a gas purging to flow the inert gas into processing container 192 or a purging by evacuation.

In step ST5g subsequent to sequence SQ2, it is determined whether to end the performance of sequence SQ2. Specifically, in step ST5g, it is determined whether the number of performing times of sequence SQ2 reaches the preset number of times. The determination of the number of performing times of sequence SQ2 corresponds to a determination of the etching amount of the film LA. Sequence SQ2 may be repeatedly performed such that the film LA is etched until the etching amount of the film LA reaches a preset value. As the number of performing times of sequence SQ2 increases, the etching amount of the film LA also increases (substantially linearly). Thus, the number of performing times of sequence SQ2 may be determined such that the product of the thickness of the film LA etched by sequence SQ2 performed once (unit cycle) (the thickness of the mixture layer MX formed in step ST5c performed once) and the number of performing times of sequence SQ2 becomes a preset value.

Figure 17:
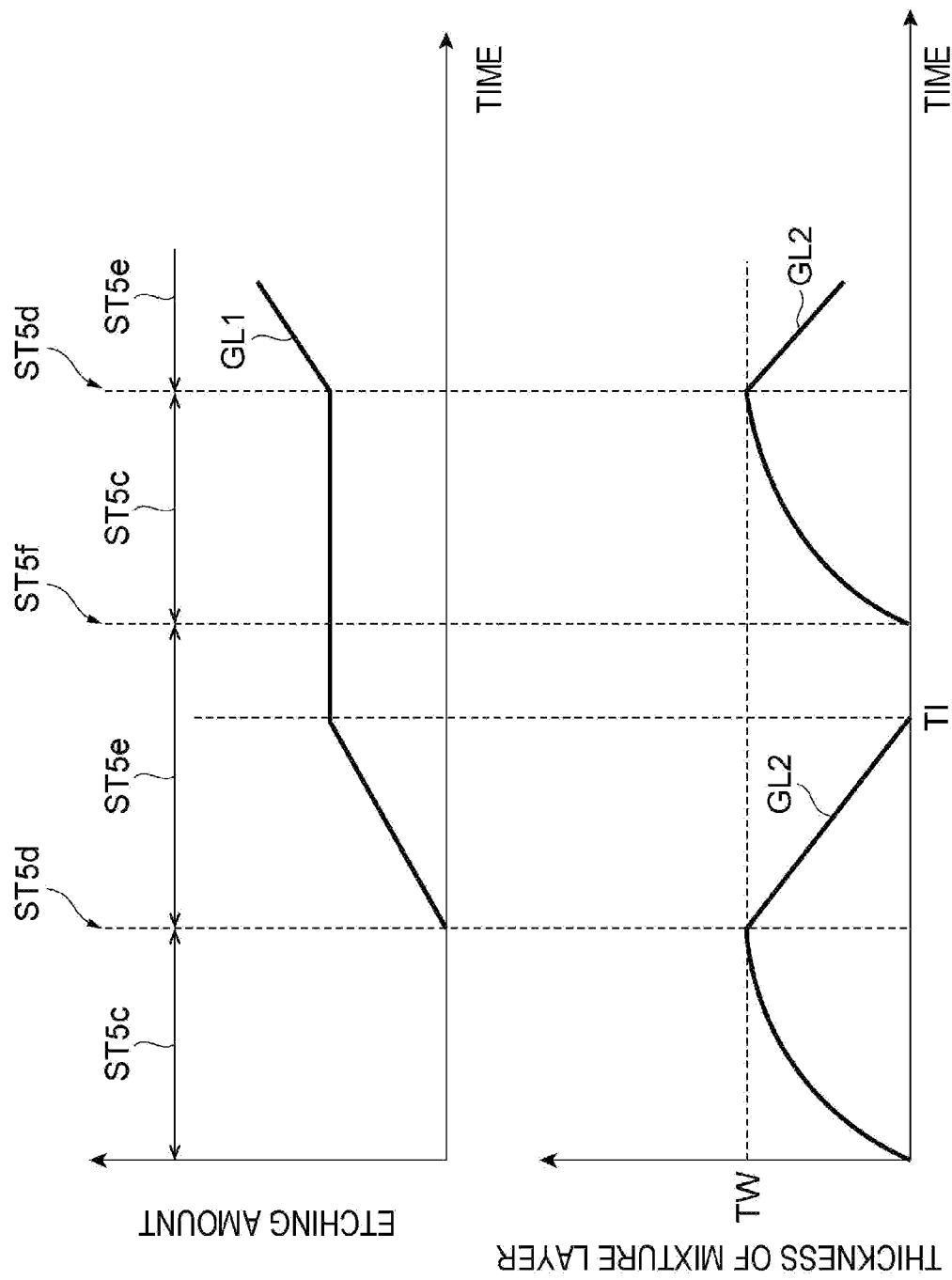
FIG. 17 is a view illustrating a variation of an etching amount of the film and a thickness of a mixture layer formed on the film during the performance of the sequence illustrated in FIG. 10.

With reference to FIG. 17, descriptions will be made on a variation of the etching amount of the film LA and a variation of the thickness of the mixture layer MX formed on the film LA, which occur during the performance of sequence SQ2. In FIG. 17, the line GL1 represents a variation of the etching amount (arbitrary unit) of the film LA which occurs during the performance of sequence SQ2, and the line GL2 represents a variation of the thickness (arbitrary unit) of the mixture layer MX which occurs during the performance of sequence SQ2. The horizontal axis of FIG. 17 indicates a time during the performance of sequence SQ2, and omits the illustration of a performance time of step ST5d and a performance time of ST5f for the simplification of illustration. As illustrated in FIG. 17, in the one-time (unit cycle) performance of sequence SQ2, step ST5c is performed until the thickness of the mixture layer MX becomes a preset value TW as indicated by the line GL2. The value TW of the thickness of the mixture layer MX formed in step ST5c may be determined by the value of the bias power applied by the high frequency power supply 64, a dose of the nitrogen ions included in the plasma of the third gas with respect to the film LA per unit time, and the performance time of step ST5c.

As illustrated in FIG. 17, in the one-time (unit cycle) performance of sequence SQ2, step ST5e is performed until the mixture layer MX formed in step ST5c is entirely removed as indicated the lines GL1 and GL2. The mixture layer MX is entirely removed by the chemical etching until the timing TI is reached during the performance of step ST5e. The timing TI may be determined by the etching rate of the chemical etching performed in step ST5e. The timing TI occurs during the performance of step ST5e. During the time period from the timing TI to the end of step ST5e, the film LA of silicon oxide after the removal of the mixture layer MX is not etched by the plasma of the fourth gas. That is, when the radicals included in the plasma of the fourth gas are used, the etching rate of the etching on silicon oxide (e.g., $SiO_2$ in an embodiment) constituting the film LA is very small, as compared with the etching rate of the etching on silicon nitride (e.g., SiN in an embodiment) included in the mixture layer MX.

When it is determined in step ST5g that the number of performing times of sequence SQ2 does not reach the preset number of times (step ST5g: NO), the performance of sequence SQ2 is repeated. Meanwhile, when it is determined in step ST5g that the number of performing times of sequence SQ2 reaches the preset number of times (step ST5g: YES), the process proceeds to step ST5h. In step ST5h, the wafer W is carried out from the plasma processing apparatus 10 to the optical observation apparatus OC and carried into the optical observation apparatus OC by the transfer robots Rb1 and Rb2. After step ST5h, step ST5 is ended, and the process returns to step ST1 to perform ST1 and its subsequent processings again.

As described above, the series of isotropic etching processings in sequence SQ2 and step ST5g may remove the surface of the film LA for each atomic layer by the same method as the ALE method. Accordingly, in the series of etching processings of sequence SQ2 and step ST5g, sequence SQ2 is repeatedly performed to remove the surface of the film LA for each atomic layer, so that the film LA is precisely etched, regardless of the portion of the surface of the wafer W (more specifically, for example, the central portion, the intermediate portion or the end portion of the surface of the wafer W) and the sizes of the trench widths. That is, sequence SQ2 is repeated as many as the preset number of times, so that the film LA is very precisely etched with the isotropical and uniform thickness (substantially the same thickness) across the surface of the wafer W, regardless of the portion of the surface of the wafer W (more specifically, for example, the central portion, the intermediate portion or the end portion of the surface of the wafer W), and the sizes of the trench widths.

Figure 18:
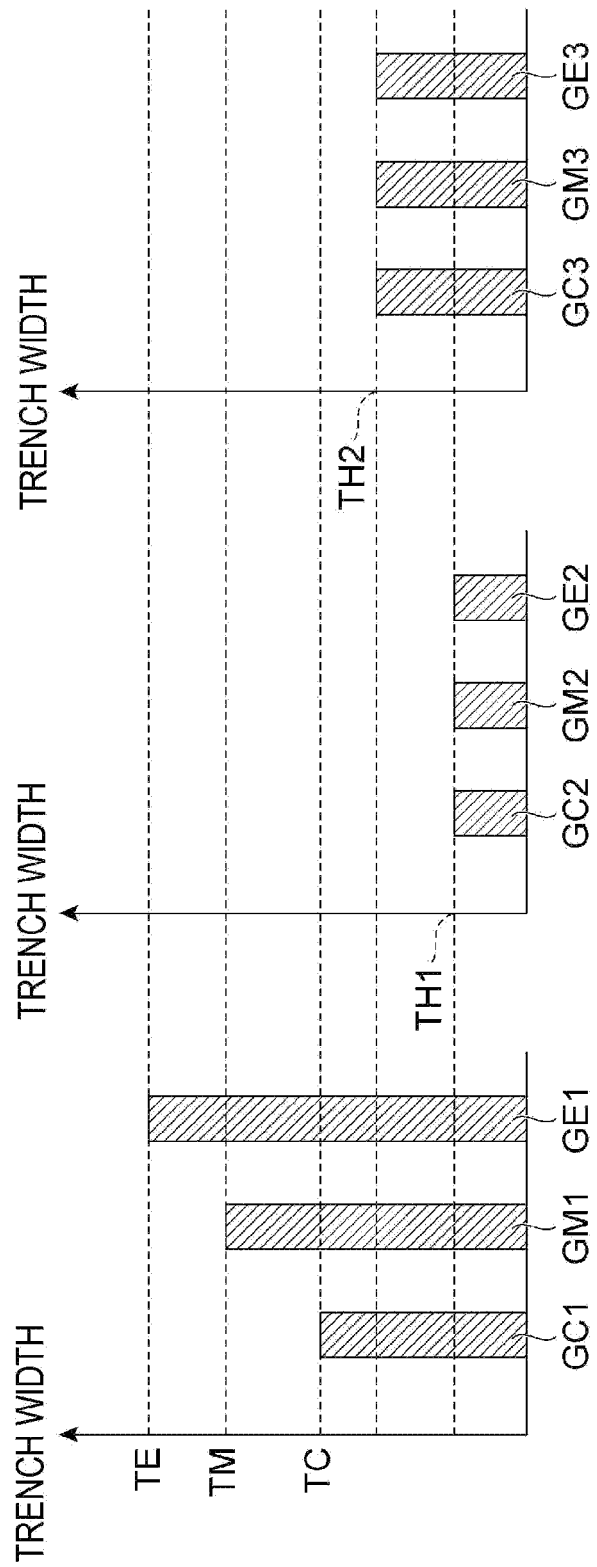
FIG. 18 illustrates bar graphs representing an effect achieved by the method illustrated in FIG. 1.

Next, the effect of the method MT according to an embodiment will be described by considering the variation of the trench width accompanied by the performance of the method MT. FIG. 18 illustrates bar graphs representing the effect achieved by the method illustrated in FIG. 1. FIG. 18 schematically illustrates the trench width before the performance of the method MT, the trench width after step ST2: YES (after the deviation of the trench width is made fall within the reference range), and the trench width after ST4: NO (after the trench width (minimum value of the trench width) is expanded to be equal to or larger than the reference width), in each of the trenches TR1 and TR2. All of the rectangular bars illustrated in the bar graphs of FIG. 18 (e.g., the bar GC1) represent the trench width of the trench TR1 or the trench width of the trench TR2.

The bar GC1 represents a value TC of the trench width WW1a or WW1b which is the trench width before the performance of the method MT and the trench width of the central portion of the surface of the wafer W, in each of the trenches TR1 and TR2. The bar GM1 represents a value TM of the trench width WW1a or WW1b which is the trench width before the performance of the method MT and the trench width of the intermediate portion of the surface of the wafer W outside the central portion (close to the end portion) on the surface of the wafer W, in each of the trenches TR1 and TR2. The bar GE1 represents a value TE of the trench width WW1a or WW1b which is the trench width before the performance of the method MT and the trench width of the end portion of the surface of the wafer W, in each of the trenches TR1 and TR2.

As illustrated in FIG. 18, in each of the trenches TR1 and TR2, the trench width before the performance of the method MT (trench width WW1a or WW1b) has a deviation on the surface of the wafer W (across the central portion, the intermediate portion, and the end portion of the surface of the wafer W). However, the deviation of the trench width (WW1*a* or WW1*b*) is made fall within the reference range after step ST2: YES.

The bar GC2 represents a value TH1 of the trench width WW2*a* or WW2*b* which is the trench width after step ST2: YES (after the deviation of the trench width is made fall within the reference range) and the trench width of the central portion of the surface of the wafer W, in each of the trenches TR1 and TR2. The bar GM2 represents a value TH1 of the trench width WW2*a* or WW2*b* which is the trench width after step ST2: YES (after the deviation of the trench width is made fall within the reference range) and the trench width of the intermediate portion of the surface of the wafer W outside the central portion (close to the end portion) on the surface of the wafer W, in each of the trenches TR1 and TR2. The bar GE2 represents a value TH1 of the trench width WW2*a* or WW2*b* which is the trench width after step ST2: YES (after the deviation of the trench width is made fall within the reference range) and the trench width of the end portion of the surface of the wafer W, in each of the trenches TR1 and TR2.

As illustrated in FIG. 18, in each of the trenches TR1 and TR2, the trench width after step ST2: YES (after the deviation of the trench width is made fall within the reference range) (trench width WW2*a* or WW2*b*) is adjusted to the uniform trench width TH1, but is narrower than a reference width TH2. Thus, the trench width (minimum value of the trench width) is expanded to be equal to or larger than the reference width TH2 after ST4: NO.

The bar GC3 represents a value TH2 of the trench width WW3*a* or WW3*b* which is the trench width after step ST4: NO (after the trench width (minimum value of the trench width) is expanded to be equal to or larger than the reference width) and the trench width of the central portion of the surface of the wafer W, in each of the trenches TR1 and TR2. The bar GM3 represents a value TH2 of the trench width WW3*a* or WW3*b* which is the trench width after step ST4: NO (after the trench width (minimum value of the trench width) is expanded to be equal to or larger than the reference width) and the trench width of the intermediate portion of the surface of the wafer W outside the central portion (close to the end portion) on the surface of the wafer W, in each of the trenches TR1 and TR2. The bar GE3 represents a value TH2 of the trench width WW3*a* or WW3*b* which is the trench width after step ST4: NO (after the trench width (minimum value of the trench width) is expanded to be equal to or larger than the reference width) and the trench width of the end portion of the surface of the wafer W, in each of the trenches TR1 and TR2.

As illustrated in FIG. 18, in each of the trenches TR1 and TR2, step ST5 is repeatedly performed after step ST2: YES (after the deviation of the trench width is made fall within the reference range), so that the trench width (minimum value of the trench width) may be adjusted to the reference width TH2. Accordingly, in each of the trenches TR1 and TR2, when the trench width (WW1*a* or WW1*b*) has a deviation on the surface of the wafer W before the performance of the method MT, the deviation on the surface of the wafer W may be sufficiently resolved, and the trench width may be adjusted to the reference width TH2 by performing the method MT, regardless of the portion of the surface of the wafer W (across the central portion, the intermediate portion, and the end portion of the surface of the wafer W).

Figures 19A, 19B:
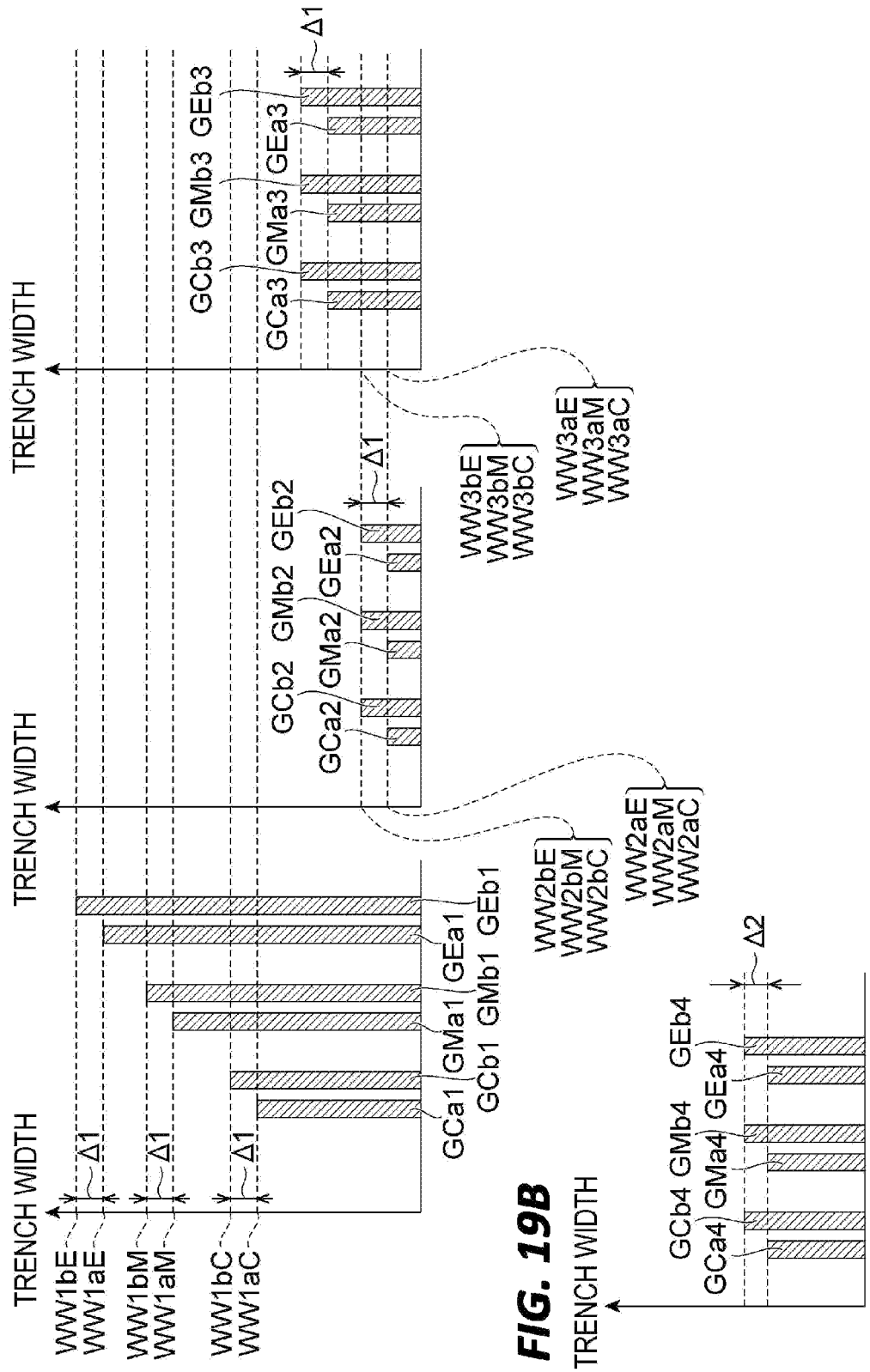
FIGS. 19A and 19B illustrate bar graphs representing an example of the effect achieved by the method illustrated in FIG. 1.

More detailed descriptions will be made with reference to FIGS. 19A and 19B. FIGS. 19A and 19B illustrate bar graphs representing an example of the effect achieved by the method illustrated in FIG. 1. FIG. 19A schematically illustrates the trench widths (WW1*a* and WW1*b*) of the trenches TR1 and TR2 before the performance of the method MT, the trench widths (WW2*a* and WW2*b*) of the trenches TR1 and TR2 after step ST2: YES (after the deviation of the trench width is made fall within the reference range), and the trench widths (WW3*a* and WW3*b*) of the trenches TR1 and TR2 after step ST4: NO (the trench width (minimum value of the trench width) is expanded to be equal to or larger than the reference width).

The bar GCa1 represents a value WW1*a*C of the trench width WW1*a* which is the trench width of the trench TR1 before the performance of the method MT and the trench width of the central portion of the surface of the wafer W. The bar GCb1 represents a value WW1*b*C of the trench width WW1*b* which is the trench width of the trench TR2 before the performance of the method MT and the trench width of the central portion of the surface of the wafer W. The relationships of WW1*b*C>WW1*a*C and WW1*b*C−WW1*a*C=Δ1 are met.

The bar GMa1 represents a value WW1*a*M of the trench width WW1*a* which is the trench width of the trench TR1 before the performance of the method MT and the trench width of the intermediate portion of the surface of the wafer W outside the central portion (close to the end portion) on the surface of the wafer W. The bar GMb1 represents a value WW1*b*M of the trench width WW1*b* which is the trench width of the trench TR2 before the performance of the method MT and the trench width of the intermediate portion of the surface of the wafer W outside the central portion (close to the end portion) on the surface of the wafer W. The relationships of WW1*b*M>WW1*a*M and WW1*b*M−WW1*a*M=Δ1 are met.

The bar GEa1 represents a value WW1*a*E of the trench width WW1*a* which is the trench width of the trench TR1 before the performance of the method MT and the trench width of the end portion of the surface of the wafer W. The bar GEb1 represents a value WW1*b*E of the trench width WW1*b* which is the trench width of the trench TR2 before the performance of the method MT and the trench width of the end portion of the surface of the wafer W. The relationships of WW1*b*E>WW1*a*E and WW1*b*E−WW1*a*E=Δ1 are met.

The bar GCa2 represents a value WW2*a*C of the trench width WW2*a* which is the trench width of the trench TR1 after step ST2: YES (after the deviation of the trench width is made fall within the reference range) and the trench width of the central portion of the surface of the wafer W. The bar GCb2 represents a value WW2*b*C of the trench width WW2*b* which is the trench width of the trench TR2 after step ST2: YES (after the deviation of the trench width is made fall within the reference range) and the trench width of the central portion of the surface of the wafer W. The relationships of WW2*b*C>WW2*a*C and WW2*b*C−WW2*a*C=Δ1 are met.

The bar GMa2 represents a value WW2*a*M of the trench width WW2*a* which is the trench width of the trench TR1 after step ST2: YES (after the deviation of the trench width is made fall within the reference range) and the trench width of the intermediate portion of the surface of the wafer W outside the central portion (close to the end portion on the surface of the wafer W. The bar GMb2 represents a value WW2*b*M of the trench width WW2*b* which is the trench width of the trench TR2 after step ST2: YES (after the deviation of the trench width is made fall within the reference range) and the trench width of the intermediate portion of the surface of the wafer W outside the central portion (close to the end portion) on the surface of the wafer W. The relationships of WW2$b$M>WW2$a$M and WW2$b$M−WW2$a$M=Δ1 are met.

The bar GEa2 represents a value WW2$a$E of the trench width WW2$a$ which is the trench width of the trench width TR1 after step ST2: YES (after the deviation of the trench width is made fall within the reference range) and the trench width of the end portion of the surface of the wafer W. The bar GEb2 represents a value WW2$b$E of the trench width WW2$b$ which is the trench width of the trench TR2 after step ST2: YES (after the deviation of the trench width is made fall within the reference range) and the trench width of the end portion of the surface of the wafer W. The relationships of WW2$b$E>WW2$a$E and WW2$b$E−WW2$a$E=Δ1 are met.

In the trench TR1, the relationship of WW2$a$C=WW2$a$M=WW2$a$E is met, and in the trench TR2, the relationship of WW2$b$C=WW2$b$M=WW2$b$E is met.

Accordingly, after step ST2: YES, the deviation of the trench width of the trench TR1 on the surface of the wafer W (the deviation across the central portion, the intermediate portion, and the end portion of the surface of the wafer W), and the deviation of the trench width of the trench TR2 on the surface of the wafer W (the deviation across the central portion, the intermediate portion, the end portion of the surface of the wafer W) may be resolved while the difference Δ1 between the trench widths of the trenches TR1 and TR2 is maintained.

The bar GCa3 represents a value WW3$a$C of the trench width WW3$a$ which is the trench width of the trench TR1 after step ST4: NO (after the trench width (minimum value of the trench width) is expanded to be equal to or larger than the reference width) and the trench width of the central portion of the surface of the wafer W. The bar GCb3 represents a value WW3$b$C of the trench width WW3$b$ which is the trench width of the trench TR2 after step ST4: NO (after the trench width (the minimum value of the trench width) is expanded to be equal to or larger than the reference width) and the trench width of the central portion of the surface of the wafer W. The relationships of WW3$b$C>WW3$a$C and WW3$b$C−WW3$a$C=Δ1 are met.

The bar GMa3 represents a value WW3$a$M of the trench width WW3$a$ which is the trench width of the trench TR1 after step ST4: NO (after the trench width (minimum value of the trench width) is expanded to be equal to or larger than the reference width) and the trench width of the intermediate portion of the surface of the wafer W outside the central portion (close to the end portion) on the surface of the wafer W. The bar GMb3 represents a value WW3$b$M of the trench width WW3$b$ which is the trench width of the trench TR2 after step ST4: NO (after the trench width (minimum value of the trench width) is expanded to be equal to or larger than the reference width) and the trench width of the intermediate portion of the surface of the wafer W outside the central portion (close to the end portion) on the surface of the wafer W. The relationships of WW3$b$M>WW3$a$M and WW3$b$M−WW3$a$M=Δ1 are met.

The bar GEa3 represents a value WW3$a$E of the trench width WW3$a$ which is the trench width of the trench TR1 after step ST4: NO (after the trench width (minimum value of the trench width) is expanded to be equal to or larger than the reference width) and the trench width of the end portion of the surface of the wafer W. The bar GEb3 represents a value WW3$b$E of the trench width WW3$b$ which is the trench width of the trench TR2 after step ST4: NO (after the trench width (minimum value of the trench width) is expanded to be equal to or larger than the reference width) and the trench width of the end portion of the surface of the wafer W. The relationships of WW3$b$E>WW3$a$E and WW3$b$E−WW3$a$E=Δ1 are met.

In the trench TR1, the relationship of WW3$a$C=WW3$a$M=WW3$a$E is met, and in the trench TR2, the relationship of WW3$b$C=WW3$b$M=WW3$b$E is met. In addition, in the trench TR1, WW3$a$C (=WW3$a$M=WW3$a$E) is larger than WW2$a$C (=WW2$a$M=WW2$a$E), and in the trench TR2, WW3$b$C (=WW3$b$M=WW3$b$E) is larger than WW2$b$C (=WW2$b$M=WW2$b$E).

Thus, in the trenches TR1 and TR2, when each trench width has a deviation on the surface of the wafer W before the performance of the method MT, the deviation on the surface of the wafer W (the deviation across the central portion, the intermediate portion, and the end portion of the surface of the wafer W) may be sufficiently resolved, and the trench width may be precisely adjusted to the reference width, by performing the method M, while the difference Δ1 between the trench widths of the trenches TR1 and TR2 is maintained.

In addition, when the film LA is etched by an etching method of the related art (different from the method MT and referred to as the "etching method EM") without using step ST5 in order to adjust the trench width to the reference width, a difference Δ2 between the trench widths of the trenches TR1 and TR2 may become larger than the difference Δ1 between the trench widths of the trenches TR1 and TR2 before the performance of the method MT, as illustrated in FIG. 19B. That is, there may be a case where Δ2>Δ1.

The bar GCa4 represents a value of the trench width WW3$a$ which is the trench width of the trench TR1 after the etching method EM of the related art and the trench width of the central portion of the surface of the wafer W. The bar GCb4 represents a value of the trench width WW3$b$ which is the trench width of the trench TR2 after the etching method EM of the related art and the trench width of the central portion of the surface of the wafer W. The bar GMa4 represents a value of the trench width WW3$a$ which is the trench width of the trench TR1 after the etching method EM of the related art and the trench width of the intermediate portion of the surface of the wafer W outside the central portion (close to the end portion) on the surface of the wafer W. The bar GMb4 represents a value of the trench width WW3$b$ which is the trench width of the trench TR2 after the etching method EM of the related art and the trench width of the intermediate portion of the surface of the wafer W outside the central portion (close to the end portion) on the surface of the wafer W. The bar GEa4 represents a value of the trench width WW3$a$ which is the trench width of the trench TR1 after the etching method EM of the related art and the trench width of the end portion of the surface of the wafer W. The bar GEb4 represents a value of the trench width WW3$b$ which is the trench width of the trench TR2 after the etching method EM of the related art and the trench width of the end portion of the surface of the wafer W.

As illustrated in FIG. 19B, when the film LA is etched by the etching method EM of the related art in order to adjust the trench width to the reference width, the difference Δ2 between the trench widths of the trenches TR1 and TR2 after the etching method EM may become larger than the difference Δ1 between the trench widths of the trenches TR1 and TR2 before the performance of the method MT.

In addition, when the film thickness of the film LA formed by steps ST1 to ST3 is relatively thick, the opening of a trench having a relatively narrow trench width may be clogged. In order to cope with this situation, the basic process of the method MT may be repeatedly performed by making the film thickness of the film LA formed by steps ST1 to ST3 relatively thin to the extent that the opening of the trench is not clogged. The basic process is repeated until the trench width (more specifically, the smallest trench width among the trench widths of the plurality of trenches provided on the surface of the wafer W) reaches the reference width. In this case, each time the method MT is repeated, the reference range of the trench width which is used in step ST2 is reduced step by step. FIG. 20 is a view schematically illustrating a variation of the trench width in each of the trenches TR1 and TR2 when the method illustrated in FIG. 1 is repeatedly performed. More specifically, FIG. 20 represents a variation of the trench width of the trench TR1 (or TR2) at the central portion of the surface of the wafer W, and a variation of the trench width of the trench TR1 (or TR2) at the end portion of the surface of the wafer W. In addition, the contents illustrated in FIG. 20 (lines GRd1 and GRd2) correspond to only either the trench TR1 or TR2.

The horizontal axis of FIG. 20 indicates a processing time, and the vertical axis of FIG. 20 indicates the trench width. The line GRd1 represents a variation of the value WC of the trench width of the trench TR1 (or TR2) at the central portion of the surface of the wafer W. The line GRd2 represents a variation of the value WE of the trench width of the trench TR1 (or TR2) at the end portion of the surface of the wafer W. When the line GRd1 represents a variation of the value of the trench width of the trench TR1, the line GRd2 also represents a variation of the value of the trench width of the trench TR1. In addition, when the line GRd1 represents a variation of the value of the trench width of the trench TR2, the line GRd2 also represents a variation of the value of the trench width of the trench TR2.

At the time when the method MT is started, the value WC of the trench width of the trench TR1 (or TR2) at the central portion of the surface of the wafer W is smaller than the value WE of the trench width of the trench TR1 (or TR2) at the end portion of the surface of the wafer W. In the section V1, step ST3 is performed once or multiple times. At the timing TM1, the determination of step ST2: YES is performed. In the section V2, step ST5 is performed once or multiple times. At the timing TM2, the determination of step ST4: NO is performed. The difference H1 between the value WC of the trench width and the value WE of the trench width at the timing TM 1 is within the reference range used for the determination at the timing TM1. Each time the method MT is repeated, the reference range used for the determination at the timing TM1 (more specifically, used in step ST2) is reduced step by step as illustrated in FIG. 20. Accordingly, each time the basic process is repeated, the difference H1 between the value WC of the trench width and the value WE of the trench width may be reduced step by step. In addition, in the etching by the surface modification using the ALE method (step ST5) which is performed in the section V2, the film LA is isotropically and uniformly etched across the entire surface of the wafer W. Thus, the difference H1 between the value WC trench width and the value WE of the trench width at the timing TM1 is maintained from the timing TM1 until the timing TM2 throughout the section V2.

In the method described above, based on the fact that the film thickness of the film formed in the film formation processing of repeatedly performing sequence SQ1 by the same method as the ALD method varies according to the temperature of the surface on which the film is to be formed (the surface of the wafer W, especially, the inner surfaces of the trenches), the film formation processing is performed after the temperature of each region ER of the surface of the wafer W is adjusted in step ST3c so as to reduce the deviation of the trench widths of the plurality of trenches provided in the surface of the wafer W, on the corresponding surface (to improve the in-plane uniformity of the trench widths on the surface of the wafer W). Thus, while the deviation of the trench widths of the plurality of trenches provided in the surface of the wafer W, on the corresponding surface, is reduced, the film LA including silicon oxide is very precisely formed on the inner surfaces of the trenches for each atomic layer. In addition, when the trench widths of the trenches in which the film LA is formed is narrower than the reference width, the etching processing of repeatedly performing sequence SQ2 by the same method as the ALE method is performed in order to expand the trench widths. Thus, the surface of the film LA provided in the inner surfaces of the trenches is isotropically and uniformly etched, and the trench widths are adjusted to the desired reference width. Accordingly, when the deviation of the trench widths occurs on the surface of the wafer W, it is possible to adjust the trench widths to the desired reference width while sufficiently reducing the deviation.

In addition, the basic process returns to step ST1 after the performance of step ST3 and the performance of step ST5. Since the basic process returns to step ST1 of measuring the trench widths after the performance of step ST3 of adjusting the trench widths by forming a film and the performance of step ST5 of expanding the trench widths by an etching, it is possible to more precisely adjust the trench widths.

In addition, the basic process of the method MT is repeatedly performed, and the reference range is reduced step by step each time the performance of the basic process is repeated. Accordingly, by repeatedly performing the basic process while reducing the reference range of the deviation of the trench width step by step, the adjustment of the trench width is possible while relatively gradually increasing the thickness of the film formed in step ST3 step by step. Thus, even when the trenches include a trench having a relatively narrow trench width, it is possible to avoid the situation where the opening of the trench is clogged by the formation of the film.

In addition, the first gas G1 includes monoaminosilane. Thus, the reaction precursor of silicon may be formed using the first gas G1 including monoaminosilane.

In addition, the aminosilane-based gas of the first gas G1 may include aminosilane having 1 to 3 silicon atoms. The aminosilane-based gas of the first gas G1 may include aminosilane having 1 to 3 amino groups. Thus, aminosilane including 1 to 3 silicon atoms may be used as the aminosilane-based gas of the first gas G1. Further, aminosilane including 1 to 3 amino groups may be used as the aminosilane-based gas of the first gas G1.

In addition, the fourth gas may be a mixture gas including $NF_3$ gas and $O_2$ gas, a mixture gas including $NF_3$ gas, $O_2$ gas, $H_2$ gas, and Ar gas, or a mixture gas including $CH_3F$ gas, $O_2$ gas, and Ar gas. Accordingly, the fourth gas containing fluorine may be implemented.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for processing a workpiece, the apparatus comprising:
 a processing container;

a placing table configured to support a workpiece in the processing container; and a controller configured to control the apparatus to:
place the workpiece on the placing table, the workpiece having a plurality of trenches, each of the trenches having a trench width;
receive measured trench width data of the plurality of trenches; and
adjust trench width of the plurality of trenches by a deposition process based on the received measured trench width data to provide an adjusted trench width such that a deviation of the adjusted trench width is within a deviation range based on received trench width data or calculated trench width data.

2. The apparatus of claim 1, wherein the controller is further configured to repeat adjusting of the trench width until both: (a) the deviation of the adjusted trench width is within the deviation range; and (b) the adjusted trench width is narrower than a reference trench width.

3. The apparatus of claim 1, wherein the controller is further configured to determine whether the deviation of the adjusted trench width is within the deviation range by comparing data of the adjusted trench width with a reference value or by comparing data of the adjusted trench width of one trench with data of the adjusted trench width of at least one other trench.

4. The apparatus of claim 1, wherein the deposition process includes:
adjusting temperatures of two or more regions on the workpiece based on the received measured trench width data of each of the plurality of trenches of the workpiece;
forming an adsorption layer on surfaces of the trenches of the workpiece by exposing the surfaces of the trenches to a gaseous precursor; and
forming a film on the surfaces of the trenches by exposing the adsorption layer to a plasma.

5. The apparatus of claim 1, wherein the controller is further configured to control the apparatus to expand the trench width by etching the film after the deposition process.

6. The apparatus of claim 5, wherein the etching includes:
(i) modifying the surface of the film to form a mixture layer,
(ii) exposing the mixture layer to a plasma to remove the mixture layer, and
(iii) repeating (i) and (ii).

7. The apparatus of claim 6, wherein the etching is performed by an Atomic Layer Etching (ALE) method in which the mixture layer is removed by an atomic layer unit thereby achieving an isotropic and uniform etching of the trenches.

8. The apparatus of claim 7, wherein the ALE method controls a pressure in the processing container, a radio-frequency power, a radio-frequency bias power, and a processing time for the etching.

9. The apparatus of claim 8, wherein each of the pressure in the processing container, the radio-frequency power, the radio-frequency bias power, and the processing time is higher than 200 mTorr, 600 W, 50 W, and longer than 400 sec, respectively.

10. The apparatus of claim 1, wherein the controller is configured to separately control adjustment of temperatures of two or more regions of the workpiece based on the measured trench width data to vary a thickness of a film in the two or more regions deposited in the deposition process.

11. The apparatus of claim 10, wherein the controller receives stored correspondence data which stores temperature and film thickness information, and adjusts the temperatures of the two or more regions to reduce deviation of trench width in the two or more regions during the deposition process.

12. The apparatus of claim 1, wherein the controller is further configured to:
determine whether, based on the received trench width data, a trench width deviation exceeds the deviation range, and in response to a determination that the trench width deviation exceeds the deviation range, performing the deposition process so that the trench width deviation is within the deviation range; and
the controller is further configured to control the apparatus to:
determine whether a trench width is smaller than a trench width value, after the trench width deviation is within the deviation reference range, and
perform an etch process in response to a determination that the trench width is smaller than the trench width value.

13. The apparatus of claim 1, wherein the controller is further configured to control the apparatus to:
determine whether a trench width is smaller than a trench width value, after the trench width deviation is within the deviation range, and
perform an etch process in response to a determination that the trench width is smaller than the trench width value.

14. The apparatus of claim 1,
wherein the plurality of trenches include a first plurality of trenches having a first trench width, and a second plurality of trenches having a second trench width larger than the first trench width, and
wherein the trench width data includes first trench width data corresponding to the first plurality of trenches and second trench width data corresponding to the second plurality of trenches, and the adjusting the trench width is performed in response to a determination that at least one of a deviation of the first trench width data or a deviation of the second trench width data exceeds the deviation range.

15. An apparatus for plasma processing, the apparatus comprising:
a processing container;
a placing table configured to support a workpiece in the processing container;
a plasma generator configured to generate a plasma in the processing container; and
a controller configured to control the apparatus to:
place the workpiece on the placing table, the workpiece having a plurality of trenches, each of the trenches having a trench width;
receive measured trench width data of each of the plurality of trenches; and
perform a trench width adjustment process in response to the trench width data to provide an adjusted trench width, the trench width adjustment process including at least one of a deposition process or an etch process such that a deviation of the adjusted trench width is within a deviation range based on received trench width data or calculated trench width data.

16. The apparatus of claim 15, wherein during the trench width adjustment process, a film is deposited with different thicknesses in different regions of the substrate to reduce a trench width deviation.

17. The apparatus of claim 16, wherein the controller is further configured to adjust substrate temperature in the different regions of the substrate to vary deposited film thicknesses in the different regions, based on temperature and film thickness correlation data, thereby reducing trench width deviation.

18. The apparatus of claim 17, wherein the controller is further configured to determine whether a trench width is smaller than a width value, and in response to a determination that the trench width is smaller than the width value, performing the etch process.

19. The apparatus of claim 15,
wherein the plurality of trenches include a first plurality of trenches having a first trench width, and a second plurality of trenches having a second trench width larger than the first trench width,
wherein the trench width data includes first trench width data corresponding to the first plurality of trenches and second trench width data corresponding to the second plurality of trenches, and the adjusting the trench width is performed in response to a determination that at least one of a deviation of the first trench width data or deviation of the second trench width data exceeds the deviation range.

20. The apparatus of claim 15, wherein the trench width adjustment process comprises:
determining whether, based on the received trench width data, a trench width deviation exceeds the deviation range, and in response to a determination that the trench width deviation exceeds the deviation range, performing the deposition process so that the trench width deviation is within the deviation range; and
after the trench width deviation is within the deviation reference range, determining whether a trench width is smaller than a trench width value, and in response to a determination that the trench width is smaller than the trench width value, performing the etch process.

* * * * *